United States Patent
Kibune et al.

(10) Patent No.: US 7,936,296 B2
(45) Date of Patent: May 3, 2011

(54) AD CONVERTER, DATA RECEIVER AND DATA RECEPTION METHOD

(75) Inventors: Masaya Kibune, Kawasaki (JP); Hisakatsu Yamaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 16 days.

(21) Appl. No.: 12/497,910

(22) Filed: Jul. 6, 2009

(65) Prior Publication Data

US 2010/0014607 A1    Jan. 21, 2010

(30) Foreign Application Priority Data

Jul. 16, 2008 (JP) .................. 2008-185107

(51) Int. Cl.
  *H03M 1/12*  (2006.01)
(52) U.S. Cl. ........... 341/155; 341/156
(58) Field of Classification Search ........ 341/155, 341/156, 159, 172
  See application file for complete search history.

(56) References Cited

U.S. PATENT DOCUMENTS

| | | | | |
|---|---|---|---|---|
| 4,857,931 A * | 8/1989 | Gulczynski | ............ | 341/156 |
| 5,225,837 A * | 7/1993 | Hosotani et al. | ........ | 341/159 |
| 5,416,485 A * | 5/1995 | Lee | ............ | 341/172 |
| 5,488,636 A * | 1/1996 | Yamada et al. | ........ | 375/340 |
| 5,539,406 A * | 7/1996 | Kouno et al. | ........ | 341/155 |
| 6,229,472 B1 * | 5/2001 | Nishida | ........ | 341/161 |
| 6,707,413 B2 * | 3/2004 | Sushihara et al. | ........ | 341/159 |
| 7,176,817 B2 * | 2/2007 | Jensen | ........ | 341/131 |
| 2006/0267826 A1 * | 11/2006 | Noguchi | ........ | 341/155 |

FOREIGN PATENT DOCUMENTS

| | | |
|---|---|---|
| JP | 5-218871 A | 8/1993 |
| JP | 2006-087064 A | 3/2006 |

* cited by examiner

*Primary Examiner* — Jean B Jeanglaude
(74) *Attorney, Agent, or Firm* — Arent Fox LLP

(57) ABSTRACT

An AD converter includes a first amplitude circuit, a second amplitude circuit, and a determination circuit. A control signal line controls a first amplitude gain of the first amplitude circuit and a second amplitude gain of the second amplitude circuit.

13 Claims, 25 Drawing Sheets

| INPUT CODE (BINARY NOTATION) | OUTPUT CODE (BINARY NOTATION) |
|---|---|
| 1010 | 111 |
| 1001 | 111 |
| 1000 | 110 |
| 0111 | 101 |
| 0110 | 101 |
| 0101 | 101 |
| 0100 | 100 |
| 0011 | 011 |
| 0010 | 010 |
| 0001 | 010 |

AD CONVERTER, DATA RECEIVER AND DATA RECEPTION METHOD

CROSS-REFERENCE TO RELATED APPLICATIONS

This application is based upon and claims the benefit of priority from the prior Japanese Patent Application No. 2008-185107, filed on Jul. 16, 2008, the entire content of which is incorporated herein by reference.

FIELD

The present invention relates to an analog-digital converter.

BACKGROUND

In signal transmission systems, a receiver converts parallel data into serial data using a multiplexer. The receiver transmits the converted serial data to a transmission line using a driver having the same output impedance as the characteristic impedance of the transmission line. The converted serial data is transmitted through the transmission line, and is input to the receiver. An input reception waveform of a signal to be received by the receiver deteriorates due to the characteristics of the transmission line. For example, a high frequency component of the received signal deteriorates. The receiver samples received data input as an analog signal using an analog-digital converter (ADC), and converts the sampled data into a digital signal. Further, the receiver performs a waveform shaping process (equalizing process) on the waveform-deteriorated received signal using an equalizer that estimates and compensates for the transmission line characteristic. A "0/1" determination is made for the waveform-shaped signal by a decision latch circuit. Then, the signal is converted from serial data to parallel data with a demultiplexer.

In transmission system standards, the data rate is determined in accordance with a specification. Like HIGH level-Definition Multimedia Interface (HDMI), a standard may be required to be applicable to a wide range of data rates from a few hundred megabits per second (Mbps) to a few gigabits per second (Gbps).

SUMMARY

According to an aspect of the invention, an AD converter includes a first amplitude circuit amplifying a first voltage difference between a first voltage of a first reference signal and a second voltage of an input signal, and outputting a first output voltage signal; a second amplitude circuit amplifying a second voltage difference between a third voltage of a second reference signal and the second voltage of the input signal, and outputting a second output voltage signal; a determination circuit performing resistance-division for the first output voltage signal and the second output voltage signal, and determining a logical value of the resistance-divided voltage value; and a control signal line controlling a first amplitude gain of the first amplitude circuit and a second amplitude gain of the second amplitude circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
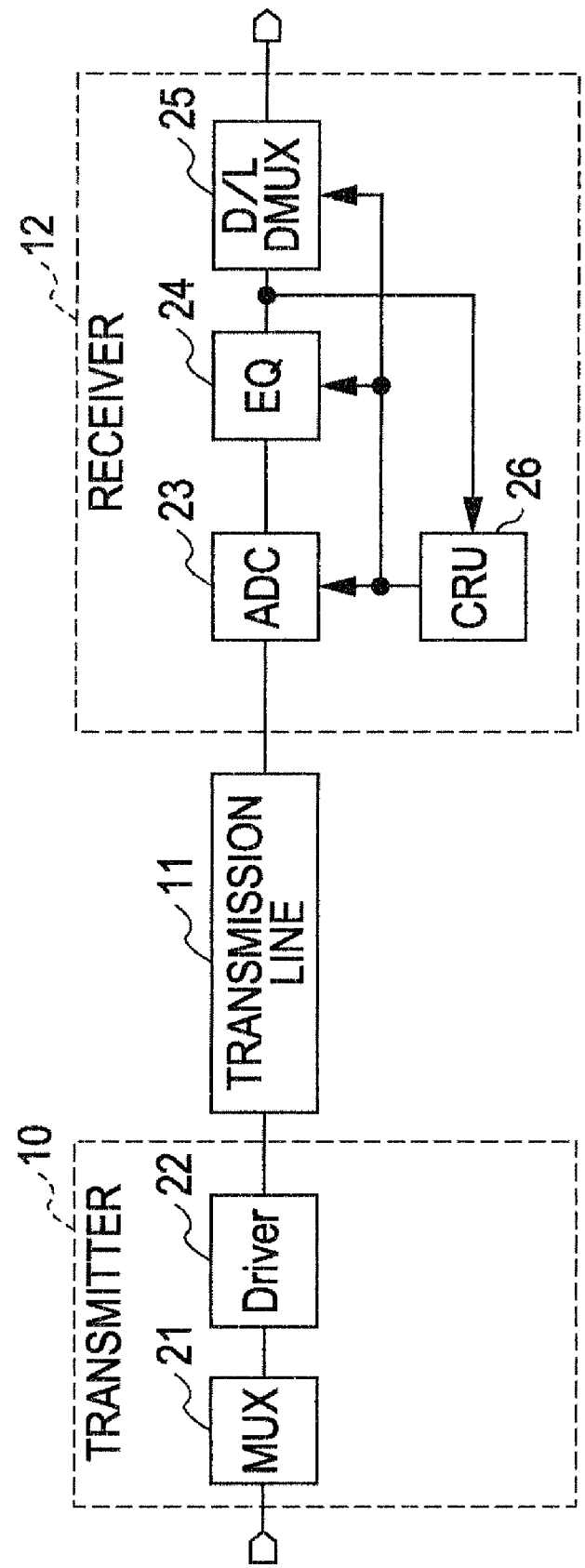
FIG. 1 is a diagram of an example of a signal transmission system.

FIG. 1 is an example of a signal transmission system. In FIG. 1, a transmitter 10 converts parallel data into serial data through a multiplexer (MUX) 21, and transmits the converted serial data to a transmission line 11 through a driver 22. The driver 22 has the same output impedance as that of the characteristic impedance of the transmission line 11. The converted serial data is transmitted through the transmission line 11, and is input to a receiver 12. The input reception waveform that is received by the receiver 12 is deteriorated due to the characteristic of the transmission line 11. An example of the deterioration is a loss of a part of a high frequency component in a received signal. The receiver 12 samples the received input, which is as an analog signal, using an ADC 23 and converts the signal into a digital signal. Further, the receiver 12 performs a waveform shaping process (equalization process) on the received signal whose waveform is deteriorated due to the transmission line. A "0/1" determination is made by a decision latch (D/L) function of a determination/de-multiplexing circuit 25 on the signal whose waveform has been shaped. Further, the serial data is converted into parallel data by a demultiplexer function (DMUX) of the determination/de-multiplexing circuit 25. Based on the received digital signal, the clock recovery circuit (CRU) 26 generates a clock signal synchronized with the received data. The ADC 23 operates in synchronization with this clock signal.

In the signal transmission system in FIG. 1, to attain a wide bandwidth of signal transmission speed, the ADC 23 is desirably operated in a wide bandwidth. A flash type ADC, performing parallel comparison, is effective as the ADC 23 to perform a parallel and collective AD conversion process in order to operate at a high speed, e.g., a few Gbps.

Figure 2:
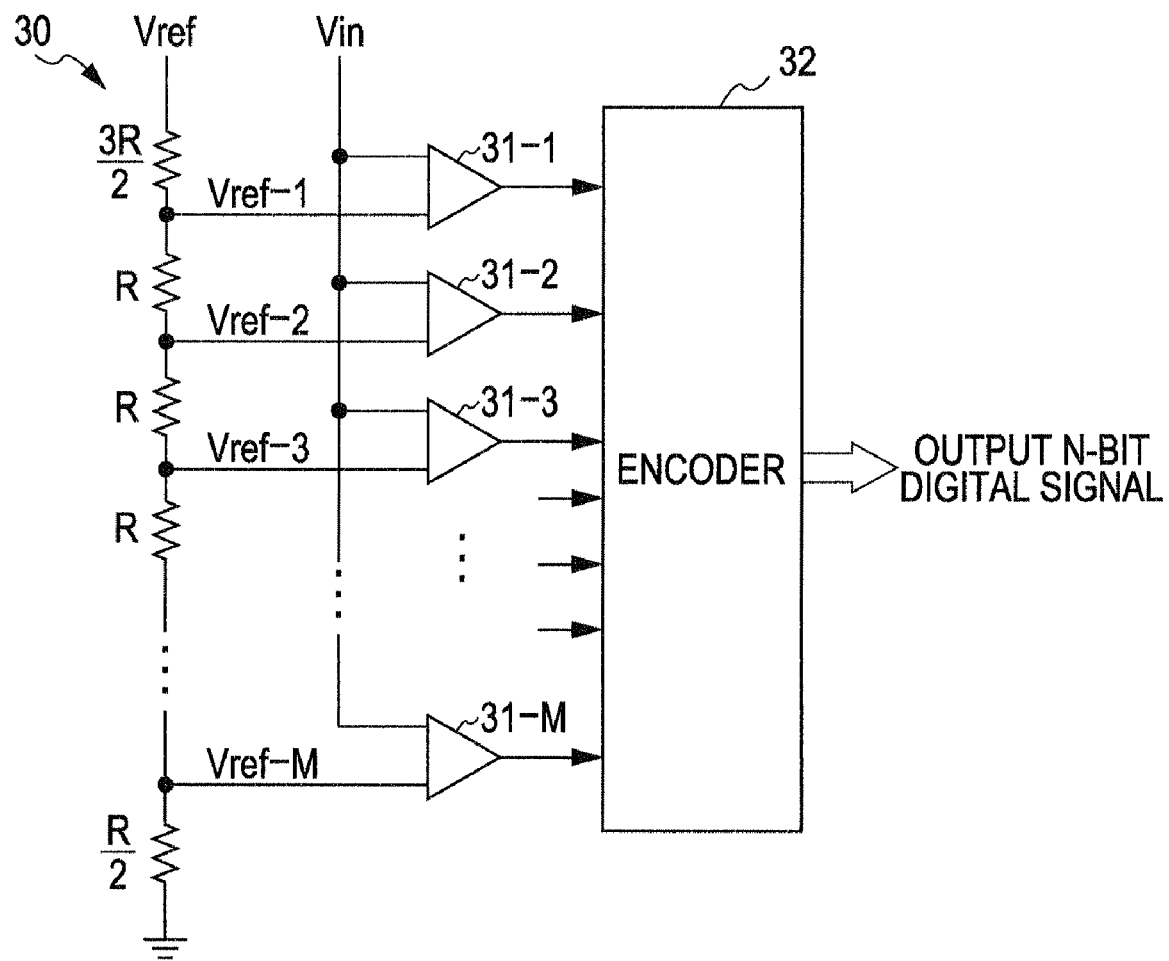
FIG. 2 is a diagram of an example of a flash type ADC.

FIG. 2 is a diagram of an example of a flash type ADC. The ADC of FIG. 2 includes a resistive element array 30, a plurality of comparators 31-1 to 31-M, and an encoder 32. When an N-bit digital signal is output, (e.g., when the encoder 32 has an N number of output signal lines), a resolution capability to divide an input voltage Vin into 2N voltage levels is obtained, The resistive element array 30 includes a plurality of resistive elements that are connected in series. By this resistive element array 30, an M (=2N−1) number of different reference voltages Vref-1 to Vref-M are generated at nodes between the resistive elements. The reference voltages Vref-1 to Vref-M are used as voltage division values of the prime reference voltage Vref. Each of the M (=2N−1) number of comparators 31-x (where "x" is an integer from 1 to M) compares a corresponding reference voltage Vref-x with an input voltage Vin. The reference voltage Vref-x is supplied from the resistive element array 30. Each of the comparators 31-x supplies the encoder 32 with an output signal in accordance with the result of comparing the corresponding reference voltage Vref-x to the input voltage Vin. For example, each of the comparators 31-x may output "1" if the input voltage Vin is greater than the corresponding reference voltage Vref-x. Or, each of the comparators 31-x may output "0" if the input voltage Vin is lower than the corresponding reference voltage Vref-x. The encoder 32 encodes the output of the M number of comparators 31-1 to 31-M, thereby to output an N bit digital signal as an encoded value.

The flash type ADC in FIG. 2 executes the above comparison processes in parallel. By so doing, the flash type ADC can execute an AD conversion process at a higher speed than a sequential comparison ADC. In the flash type ADC of FIG. 2, a number of comparators equivalent to 2N−1 are connected to the input voltage Vin. As a result, the input circuit has a large capacity value, and the operation frequency of the input signal is restricted to a low frequency.

Figure 3:
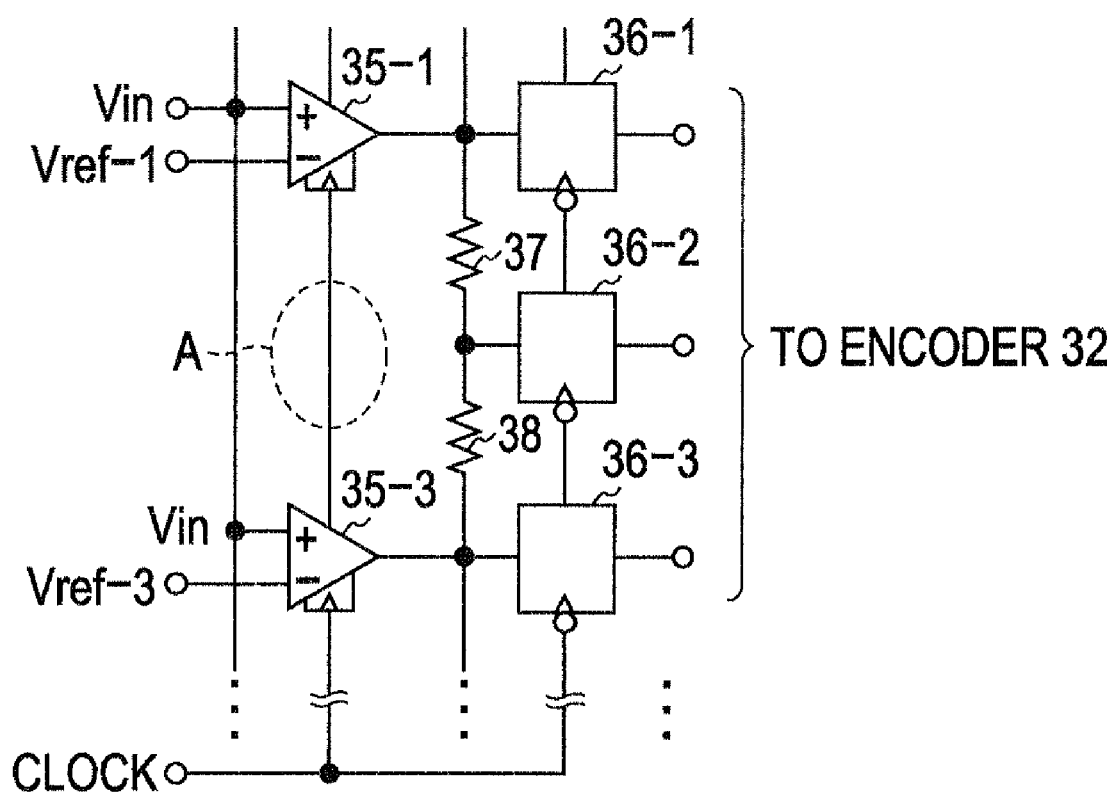
FIG. 3 is a diagram of an example of a comparison circuit of the flash type ADC.

FIG. 3 is a diagram of an example of a flash type ADC. FIG. 3 illustrates a part of a circuit corresponding to three comparison processes, as a part of the N-bit output flash type ADC. The three comparison processes are executed by comparison circuits 36-1 to 36-3 of FIG. 3, and correspond to comparison processes executed, for example, by the comparators 31-1 to 31-3 illustrated in FIG. 2. In FIG. 2, the comparison process is executed by the single comparator 31-x (where "x" is an integer from 1 to M). In fact, as illustrated in FIG. 3, the comparison process is executed by an amplitude circuit and the comparison circuit together as a pair. For example, an amplitude circuit 35-1 amplifies a differential voltage between the input voltage Vin and the reference voltage Vref-1. The comparison circuit 36-1 determines whether the amplified differential voltage is equal to or greater or lower than 0 V. An amplitude circuit 35-3 amplifies a differential voltage between the input voltage Vin and a reference voltage Vref-3. The comparison circuit 36-3 determines whether the amplified differential voltage is equal to or greater or lower than 0 V. The amplitude circuits and the comparison circuits are operated in synchronization with a clock signal, as will be described later.

In the configuration illustrated in FIG. 3, no amplitude circuit is provided in an area A. Resistive elements 37 and 38 are connected in series for resistance-division on the differential voltage output from the amplitude circuit 35-1 and the differential output from the amplitude circuit 35-3. The resistive elements 37 and 38 have the same resistance value. The comparison circuit 36-2 determines whether the resistance-divided voltage value is equal to or greater or lower than 0 V. Suppose that the configuration has one amplifier and one comparison circuit pair corresponding to each comparison process. In this case, an amplitude circuit is provided even in the blank area A, and amplifies a differential voltage between the reference voltage Vref-2 (see FIG. 2) and the input voltage Vin. The reference voltage Vref-2 is between the reference voltage Vref-1 and the reference voltage Vref-3. In this case, three amplitude circuits are coupled to the input voltage Vin. If the resistance-division is performed with the configuration illustrated in FIG. 3, the number of the amplitude circuits coupled to the input voltage Vin can be reduced.

Figure 4:
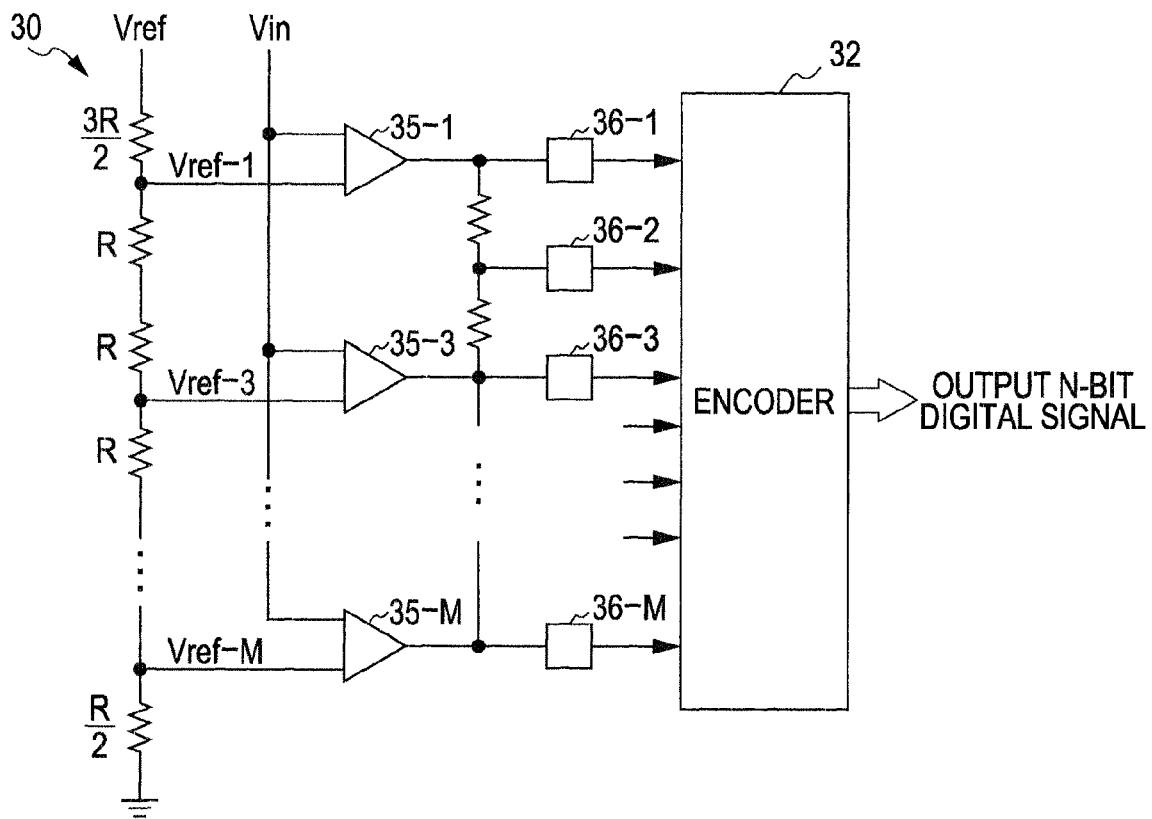
FIG. 4 is a diagram of an example of a flash type ADC which employs the circuitry configuration of FIG. 3.

FIG. 4 is an example of a flash type ADC which employs the circuitry configuration illustrated in FIG. 3. In FIG. 4, the same constituent elements as those of FIGS. 2 and 3 are identified by the same reference numerals, and will not be described again. In the configuration of FIG. 4, the comparators 31-1 to 31-M are replaced with the configuration illustrated in FIG. 3. The comparators 31-1 to 31-M execute the comparison processes of comparing the M number of reference voltages Vref-1 to Vref-M illustrated in FIG. 2. The amplitude circuits 35-1, 35-3, . . . , 35-M are provided and correspond to every other reference voltage Vref-1, Vref-3, . . . , Vref-M. The output voltage of each of the amplitude circuits is resistance-divided by the resistive element array 30. As a result of the resistance-division, target voltages to be compared are generated as interpolation voltages. The target voltages to be compared are in positions corresponding to the reference voltages Vref-2, Vref-4, . . . . The comparison circuits 36-1 to 36-M compare the voltage values of the M number of target voltages to be compared including the interpolation voltages and determine whether the voltage values are equal to or greater or lower than 0 V. This circuitry configuration is used as the ADC 23 of the signal transmission system of FIG. 1. As a result, the capacity value coupled to the input voltage Vin can be approximately half, i.e., half of an amount of a capacity load on the input signal. That is, the signal frequency at which the ADC 23 is operable can become higher. In FIGS. 3 and 4, for the sake of simple illustration, the signals are depicted in the form of a single-phase signal. In this case, the signals include the signals Vin and Vref-x that are input to each amplitude circuit and the signal output from each of the amplitude circuits. Each of the signals may be a differential signal.

A dynamic amplifier is used as the amplitude circuits 35-1 and 35-3 in FIG. 3 instead of a circuit which always operates and which is set at a fixed amplitude factor for input signals. The dynamic amplifier is operated in synchronization with a clock signal, and has characteristics that the amplitude factor changes in time series.

Figure 5:
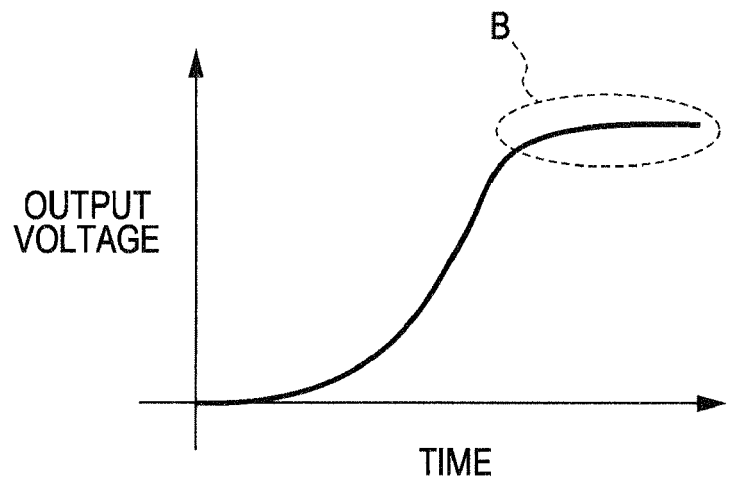
FIG. 5 is a diagram of an output waveform of an amplitude circuit as a dynamic amplifier.

FIG. 5 illustrates an output waveform of an amplitude circuit as a dynamic amplifier. In FIG. 5, the horizontal axis represents the time elapsed after the dynamic amplifier starts operating, while the vertical axis represents an output voltage of the dynamic amplifier. The output of the dynamic amplifier is generally a differential output. The output voltage illustrated in FIG. 5 corresponds to a voltage which is obtained by subtracting a signal voltage V− on the minus side of the differential output from a signal voltage V+ on the plus side of the differential output. As illustrated in FIG. 5, if the operation starts in synchronization with a clock signal, the output voltage of the dynamic amplifier for example, increases and reaches the upper limit so as to be saturated (area B) after a certain period of time elapses This upper limit is set based on a source voltage. The output signal in the saturation state indicates "0/1" information corresponding to the input signal value. Thus, the output signal does not include information regarding the voltage value of the input signal. Due to this saturation phenomenon, the comparison circuit 36-2 in FIG. 3 may not perform a normal comparison determination operation.

Figure 6:
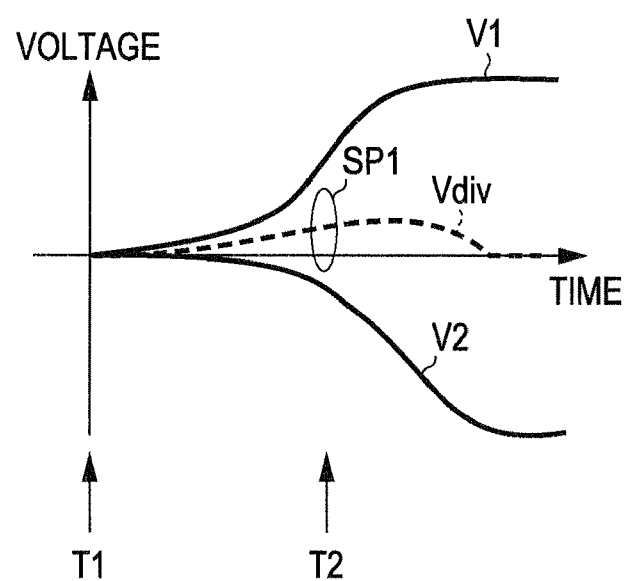
FIG. 6 is a diagram illustrating a normal comparison determination operation performed by the comparison circuit of FIG. 3.

FIG. 6 illustrates a case where the comparison circuit 36-2 of FIG. 3 performs a normal comparison determination operation. In FIG. 6, the horizontal axis represents the time elapsed after the dynamic amplifier starts operating, while the vertical axis represents an output voltage of the dynamic amplifier. A voltage waveform V1 represents an output voltage of the amplitude circuit 35-1, while a voltage waveform V2 represents an output voltage of the amplitude circuit 35-3. A voltage waveform Vdiv represents an interpolation voltage. This interpolation voltage is obtained by the resistive elements 37 and 38 dividing the output voltage V1 of the amplitude circuit 35-1 and the output voltage V2 of the amplitude circuit 35-3.

In FIG. 6, time T1 represents the timing of the rising edge of a clock signal. The clock signal reaches HIGH at the time T1. Then, the amplitude circuits 35-1 and 35-2 start operating as dynamic amplifiers. Time T2 represents the timing of the falling edge of a clock signal. The comparison circuit 36-2 executes a sampling operation at the time T2 so as to determine whether an interpolation voltage Vdiv is a positive or a negative value. In the normal operation illustrated in FIG. 6, the output voltages V1 and V2 of the amplitude circuits 35-1 and 35-2 are at a voltage build-up stage before saturation at the time T2 as the falling timing of the clock signal. A correct determination result can be obtained by sampling the interpolation voltage Vdiv at sample timing SP1 coinciding with the time T2. In this example, the amplitude of the voltage V1 is greater than that of the voltage V2. Thus, the output signal of the comparison circuit 36-2 may be a signal value (e.g., 1) representing the fact that the interpolation signal Vdiv as an input signal is equal to or greater than 0 V. Or, if the amplitude of the voltage V1 is lower than that of the voltage V2, the output signal of the comparison circuit 36-2 may be a signal value (e.g., 0) representing the fact that the interpolation signal Vdiv as an input signal is equal to or lower than 0 V.

Figure 7:
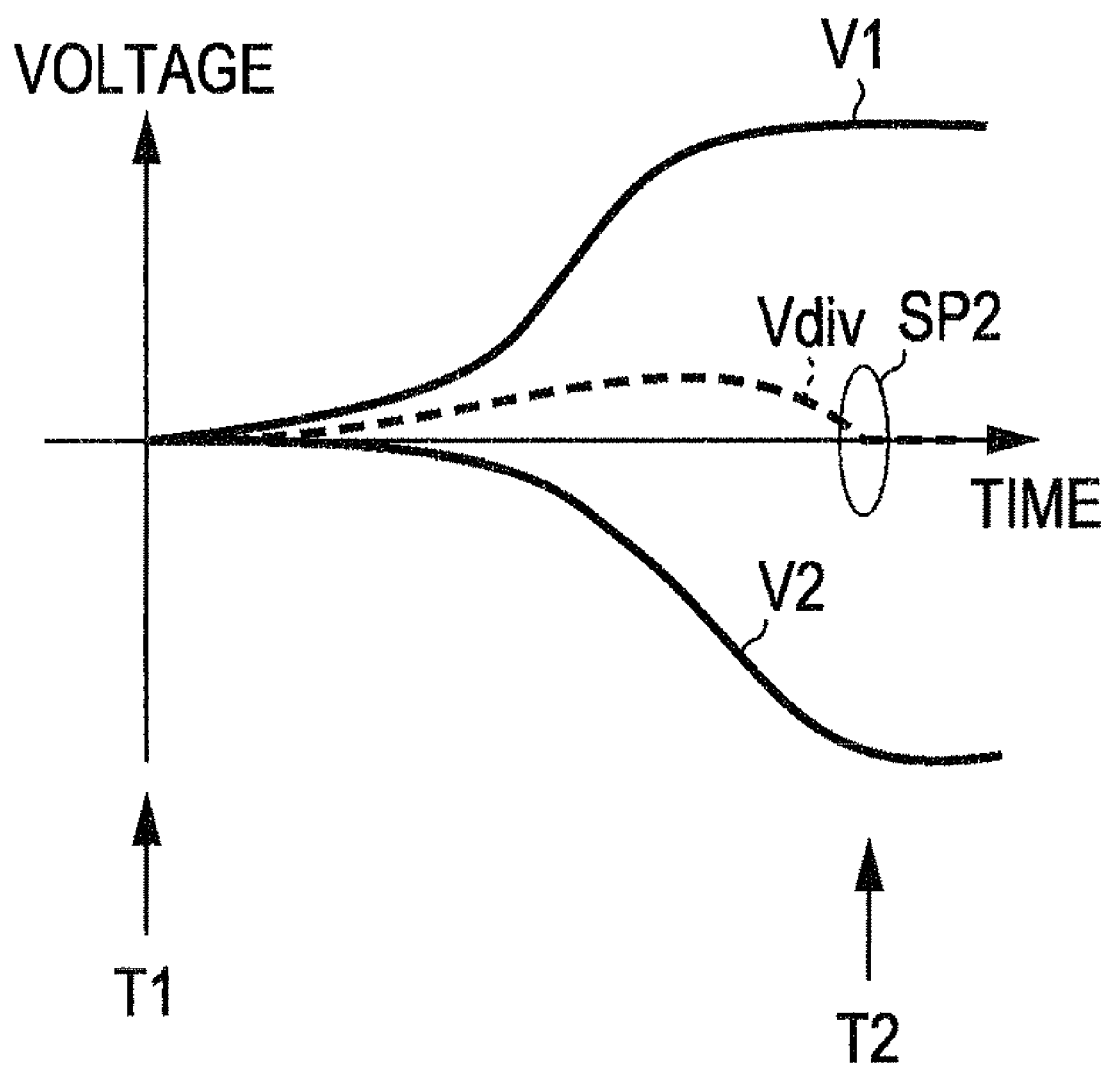
FIG. 7 is a diagram illustrating an abnormal comparison determination operation performed by the comparison circuit of FIG. 3.

FIG. 7 illustrates a case wherein the comparison circuit 36-2 of FIG. 3 performs an abnormal comparison determination operation. In FIG. 7, the same reference numerals identify the same contents illustrated in FIG. 6. In the operation example in FIG. 7, the frequency of the clock signal is lower than that in the operation example of FIG. 6, and the time T2, which represents the falling timing of the clock signal, is delayed in relation to each voltage waveform. In this case, at the time T2, which is the falling timing of the clock signal, the output voltages V1 and V2 of the amplitude circuits 35-1 and 35-2 have already been saturated. Even if the interpolation voltage Vdiv is sampled when a sample timing SP2 coincides with the time T2, a correct determination result is not outputted because the interpolation voltage Vdiv at this timing is substantially 0. Whether the output signal of the comparison circuit 36-2 is "1" or "0" depends on noise, not on the value levels between the amplitudes of the voltage V1 and the voltage V2. In this case, the least significant bit of the output of the ADC is lost.

To solve the above problem of the output of the AD converter in the saturation state, the ADC 23 in the signal transmission system in FIG. 1 preferably operates under the operation conditions illustrated in FIG. 6, regardless of the frequency of the clock signal.

Figure 8:
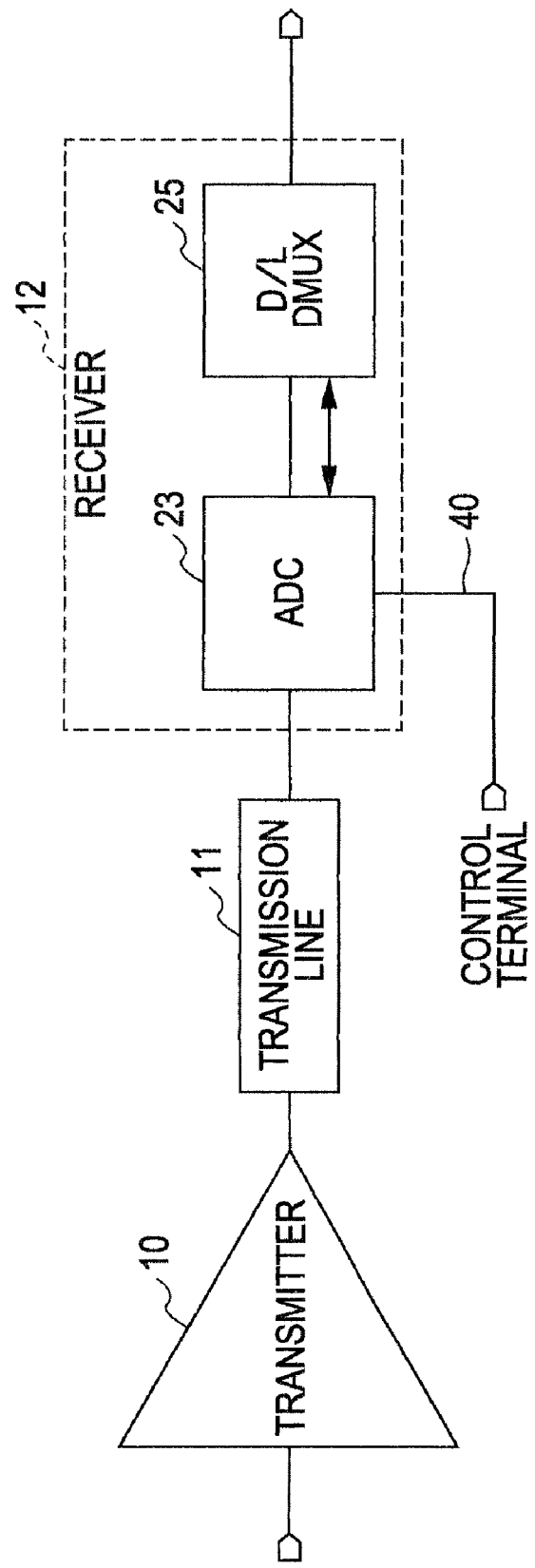
FIG. 8 is a diagram of a signal transmission system according to one embodiment of the present invention.

FIG. 8 illustrates the control, by a circuit, of an amplitude gain of the ADC 23 in accordance with a data rate of received data. In FIG. 8, the same constituent elements are identified by the same reference numerals in FIG. 1, and will not be described again. FIG. 8 omits configurations that have nothing to do directly with controlling of the amplitude gain of the ADC 23 (e.g., the equalizing circuit 24 and the determination/de-multiplexing circuit 25 in FIG. 1 are omitted).

The ADC 23 is connected to a control signal line 40. As will be described later, the amplitude gain of the amplitude circuit in the ADC 23 can be controlled by a control signal applied to the ADC 23 through the control signal line 40. The ADC 23 has the configuration illustrated in FIGS. 3 and 4. That is, the ADC 23 includes a first amplitude circuit 35-1 and a second amplitude circuit 35-3. The first amplitude circuit 35-1 amplifies a voltage difference between a first reference signal (Vref-1) and an input signal Vin. The second amplitude circuit 35-3 amplifies a voltage difference between a second reference signal (Vref-3) and an input signal Vin. The converter also includes the determination circuit 36-2 which performs resistance-division on the first output voltage of the first amplitude circuit 35-1 and the second output voltage of the second amplitude circuit 35-3. The determination circuit 36-2 determines a logical value of the resistance-divided voltage value. In this configuration, the control signal line 40 controls the amplitude gain of the first amplitude circuit 35-1 and the second amplitude circuit 35-3.

At this time, the control signal line 40 is controlled in accordance with the frequency of the clock defining the determination timing of the determination circuit 36-2. In the operation condition of FIG. 7, when the frequency of the clock signal is lower than the clock signal in the operation condition of FIG. 6, the amplitude gain of the first amplitude circuit 35-1 and the second amplitude circuit 35-3 is decreased due to a control signal applied through the control signal line 40. As a result, under the operation condition of FIG. 7, a gentle change occurs in the waveforms of the voltages V1 and V2, and the voltages V1 and V2 are not saturated in the position of the sample timing SP2. Thus, if the interpolation voltage Vdiv is sampled so as to be determined in the position of the sample timing SP2, a correct result can be obtained.

Figure 9:
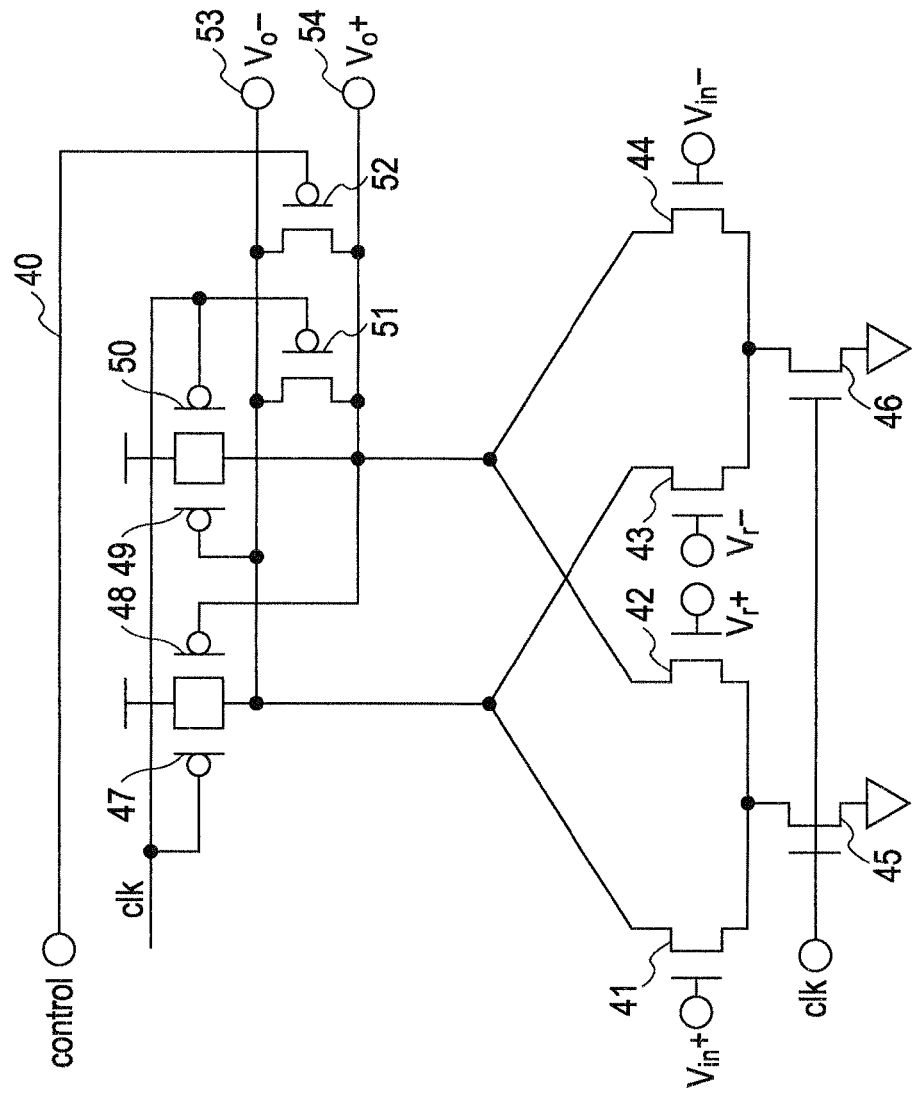
FIG. 9 is a diagram of an example of an amplitude circuit.

FIG. 9 is an example of a configuration of the amplitude circuit. The circuitry configuration of FIG. 9 is used as an amplitude circuit of each of the amplitude circuits 35-1 to 35-M in FIGS. 3 and 4. The amplitude circuit of FIG. 9 includes NMOS transistors 41 to 46 and PMOS transistors 47 to 52. A differential amplifier includes the NMOS transistors 41, 42 and 45 and the PMOS transistors 48 and 49. This differential amplifier outputs, to output terminals 53 and 54, a voltage corresponding to a difference between a plus voltage Vin+ of the differential input signal and a plus voltage Vr+ of the differential reference voltage. Another differential amplifier is formed of the NMOS transistors 43, 44, and 46, and the PMOS transistors 48 and 49. This differential amplifier outputs, to the output terminals 53 and 54, a voltage corresponding to a difference between a minus voltage Vin of the differential input signal and a minus voltage Vr− of the differential reference voltage. These two differential amplifiers are connected in parallel and are operated at the same time. As a result, the output voltage corresponding to the plus differential voltage and the minus differential voltage is output to the output terminals 53 and 54 as output voltages Vo− and Vo+.

A clock signal clk is applied to the gate of the NMOS transistors 45 and 46. If the clock signal clk is HIGH, the NMOS transistors 45 and 46 are conducting, and the amplitude circuit is operated. If the clock signal clk is LOW, the NMOS transistors 45 and 46 are not conducting, and the amplitude circuit is in a non-operating state. In the non-operating state wherein the clock signal clk is LOW, the PMOS transistors 47 and 50 are conducting, and the output terminals 53 and 54 are clamped to the HIGH source voltage. At the same time, the PMOS transistor 51 is conducting due to the LOW of the clock signal clk, and the output terminals 53 and 54 are electrically connected with each other, and the output terminals 53 and 54 become the same potential.

One end of the source/drain of the PMOS transistor 52 is coupled to the output terminal 53, while the other end thereof is coupled to the output terminal 54. The gate of the PMOS transistor 52 is connected to the control signal line 40. The resistance value for coupling the output terminals 53 and 54 can be varied by changing the voltage of a control signal "control". This control signal "control" is applied to the gate of the PMOS transistor 52 through the control signal line 40. In this manner, the amplitude gain of the differential amplitude circuit can be controlled by controlling the resistance value for coupling between two signals as differential signal outputs of the differential amplitude circuit (i.e., Vo− and Vo+ of the output terminals 53 and 54) through the control signal line 40. If the resistance value increases, a voltage difference may occur between the output terminals 53 and 54. On the contrary, if the resistance value decreases, it may be more difficult for a voltage difference to occur between the output terminals 53 and 54, and the amplitude gain is decreased.

Figure 10:
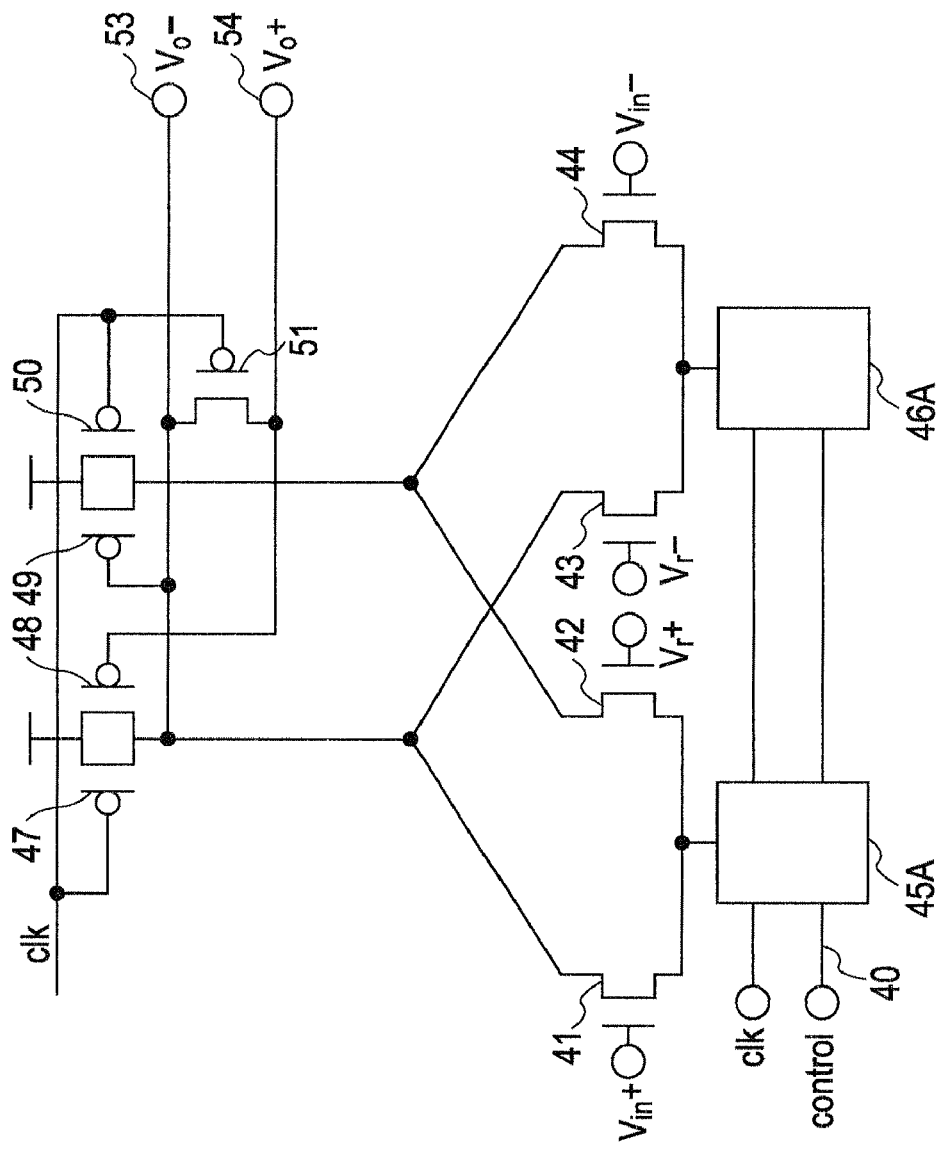
FIG. 10 is a diagram of another example of an amplitude circuit.

FIG. 10 is a diagram of another example of a configuration of an amplitude circuit. The circuitry configuration in FIG. 10 may be used as the amplitude circuit of each of the amplitude circuits 35-1 to 35-M in FIGS. 3 and 4. In FIG. 10, the same constituent elements as those of FIG. 9 are identified by the same reference numerals, and will not be explained again. The amplitude circuit of FIG. 10 includes the NMOS transistors 41 to 44, the PMOS transistors 47 to 51, and current sources 45A and 46A. A difference from the configuration of FIG. 9 is that the NMOS transistors 45 and 46 are replaced with the current sources 45A and 46A. In addition, in FIG. 10, the PMOS transistor 52 is omitted. A control signal "control" is supplied to the current sources 45A and 46A through the control signal line 40. The amplitude gain of the amplitude circuit is controlled by controlling an amount of current flowing to the internal current source transistor in response to the control signal "control".

Figure 11:
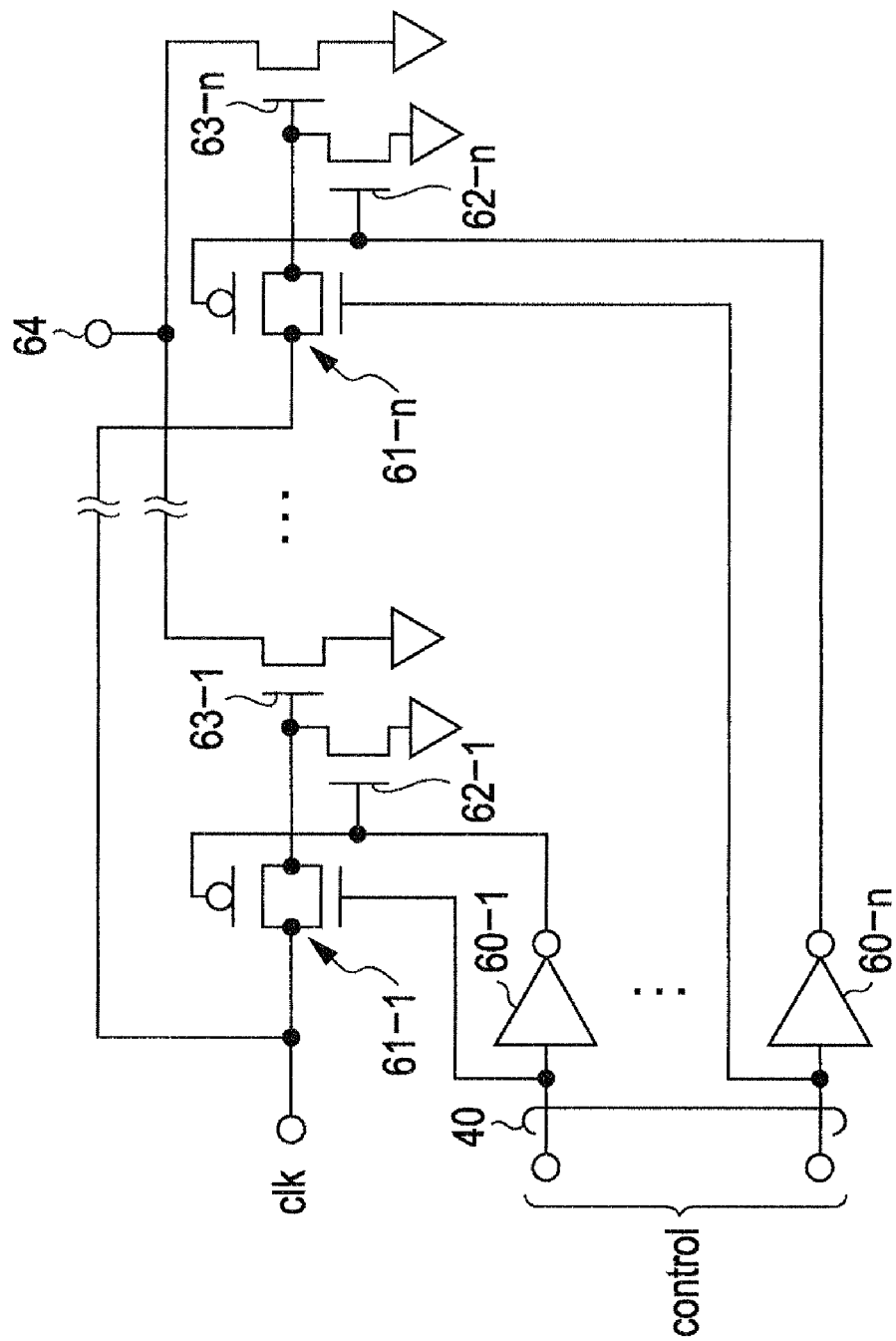
FIG. 11 is a diagram of an example of a current source illustrated in FIG. 10.

FIG. 11 is a diagram of an example of a configuration of the current source illustrated in FIG. 10. Each of the current sources 45A and 46A in FIG. 10 may be realized by the circuitry configuration in FIG. 11. The current source of FIG. 11 includes an n-number of inverters 60-1 to 60-n, an n-number of transfer gates 61-1 to 61-n, an n-number of NMOS transistors 62-1 to 62-n, and an n-number of NMOS transistors 63-1 to 63-n. In the case of the current source 45A, the node 64 coupled to the drain of the NMOS transistors 63-1 to 63-n is coupled to the source end of the NMOS transistors 41 and 42 of FIG. 10. In the case of the current source 46A, the node 64 is coupled to the source end of the NMOS transistors 43 and 44 of FIG. 10.

The control signal line 40 includes a plurality of signal lines. The control signal "control" is a plural bit signal. When an $x^{th}$ bit of the control signal "control" is HIGH, the transfer gate 61-x is conducting, and the NMOS transistor 62-x is not conducting. In this state, the NMOS transistor 63-x functions as a current source transistor of the amplitude circuit in FIG. 10. When an "$x^{th}$" bit of the control signal "control" is LOW, the transfer gate 61-x is not conducting, and the NMOS transistor 62-x is conducting. In this state, the NMOS transistor 63-x is not conducting and thus does not function as a current source transistor. It is possible to adjust the amount of current flowing to the current source transistor of the amplitude circuit in accordance with how many signal lines of the n-number of signal lines of the control signal lines 40 are set to HIGH. That is, if an m-number of signal lines out of the n-number of signal lines of the control signal lines 40 are set to HIGH, an m-number of NMOS transistors 63-x are conducting, and a specific amount of current flows to the amplitude circuit. This specific amount of current is m-times larger than the amount of the drain current per transistor in an ON state. Out of the n-number of signal lines of the control signal lines 40, the rest of the signal lines (excluding the m-number of signal lines that are set to HIGH) are set to LOW. Accordingly, the amplitude gain of the amplitude circuit can be controlled by adjusting the amount of current flowing to the current source of the amplitude circuit.

Figure 12:
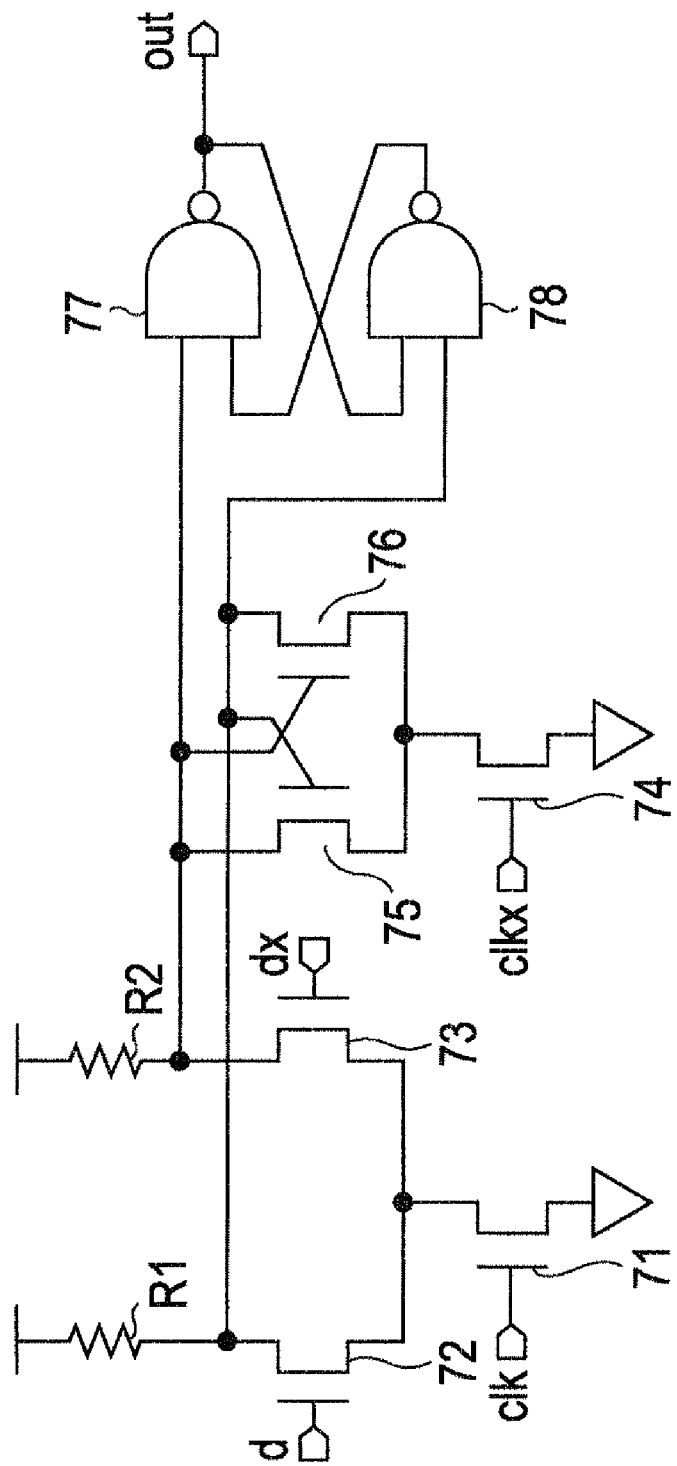
FIG. 12 is a diagram of an example of a comparison circuit.

FIG. 12 is a diagram of an example of a comparison circuit. Each of the comparison circuits 36-1 to 36-M in FIGS. 3 and 4 may be realized by the circuitry configuration of FIG. 12. The comparison circuit in FIG. 12 includes NMOS transistors 71 to 76, NAND circuits 77 and 78, and resistive elements R1 and R2. A differential input stage includes the NMOS transistors 71 to 73 and the resistive elements R1 and R2. Differential input signals d and dx are applied to the gates of the NMOS transistors 72 and 73. The differential input signals d and dx are outputs of a corresponding amplitude circuit, when there is an amplitude circuit, like the comparison circuit 36-1 in FIG. 3. The signals may correspond to, for example, voltages Vo+ and Vo− of FIG. 9. The signals are differential signals that are obtained by performing resistance-division of the voltages Vo+ and Vo− as the differential outputs of the adjacent two amplitude circuits, when there is no corresponding amplitude circuit, like the comparison circuit 36-2 in FIG. 3. When the clock signal clk is HIGH, the above-described differential input stage is operated so as to amplify the differential input signals d and dx. If the clock signal falls from HIGH to LOW, an inverted clock signal clkx rises from LOW to HIGH. In addition, a circuit including the NMOS transistors 74 to 76 is operated so as to set the output of the differential input stage. A latch circuit includes the NAND circuits 77 and 78 latches and keeps the set output of the differential input stage. An output "out" of the NAND circuit 77 is supplied to the encoder 32 in FIG. 4. Accordingly, the determination timing of the determination circuit corresponds to the falling timing of the clock signal clk. That is, the clock signal clk defines the determination timing of the determination circuit.

Figure 13:
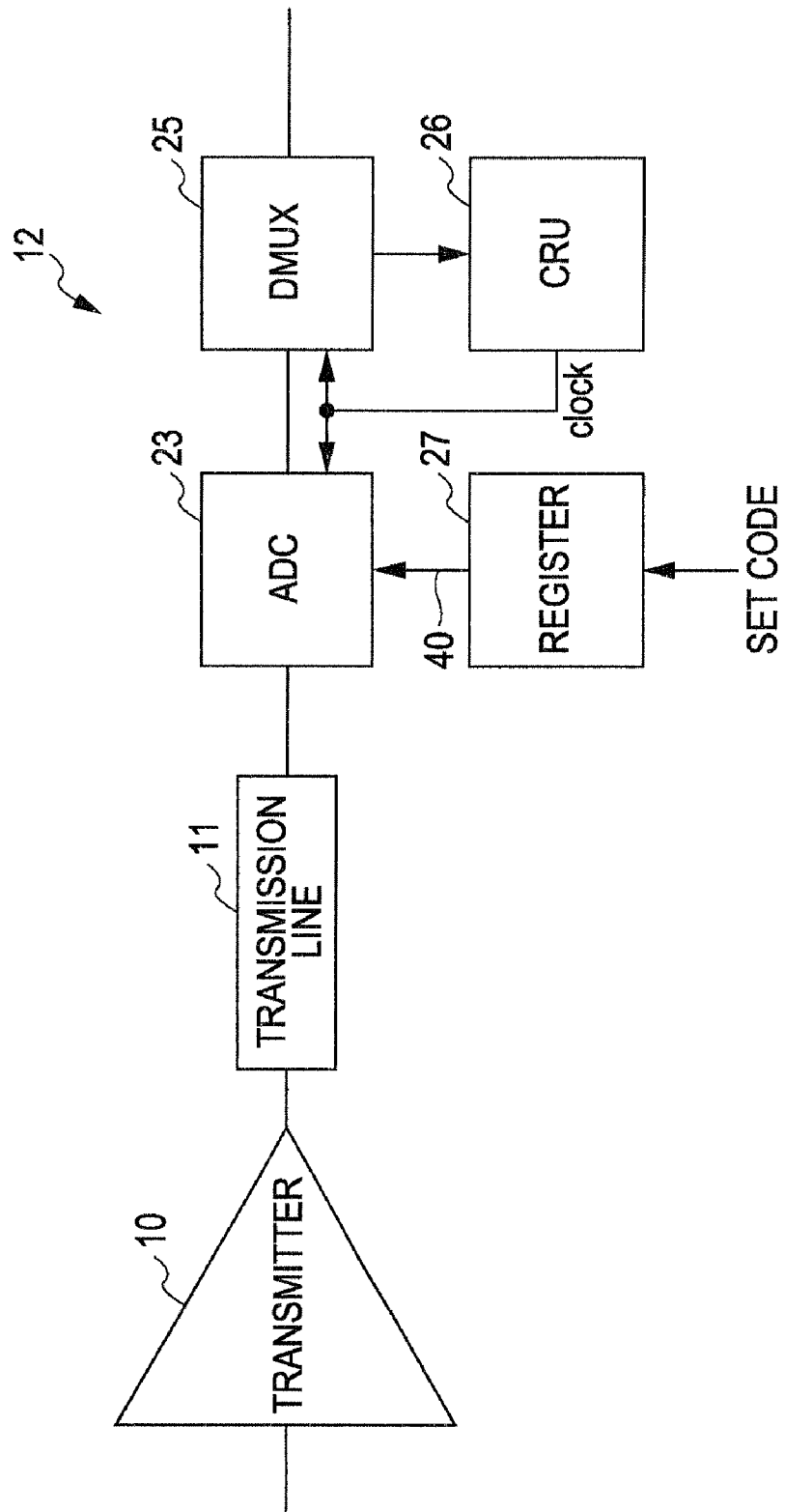
FIG. 13 is a diagram of an example of a circuit which sets a control signal for controlling an amplitude gain.

FIG. 13 is a diagram of an example of a circuit which sets a control signal for controlling the amplitude gain. In FIG. 13, the same constituent elements as those of FIG. 1 are identified by the same reference numerals, and will not be explained again. FIG. 13 omits configurations that are not directly related to controlling of the amplitude gain of the ADC 23 (e.g., the equalizing circuit 24 of FIG. 1 is omitted).

In the configuration illustrated in FIG. 13, a register 27 is provided in the receiver 12. A user of the receiver 12 sets a code corresponding to a data rate in the register 27 since the user knows the data rate in accordance with the standard for using the receiver 12. The code set in the register 27 is supplied to each amplitude circuit of the ADC 23 through the plurality of control signal lines 40. In this case, the amplitude circuit has the configuration illustrated in FIGS. 10 and 11, and adjusts an amount of current flowing to the amplitude circuit so as to control the amplitude gain in accordance with the code supplied through the plurality of control signal lines 40.

Figure 14:
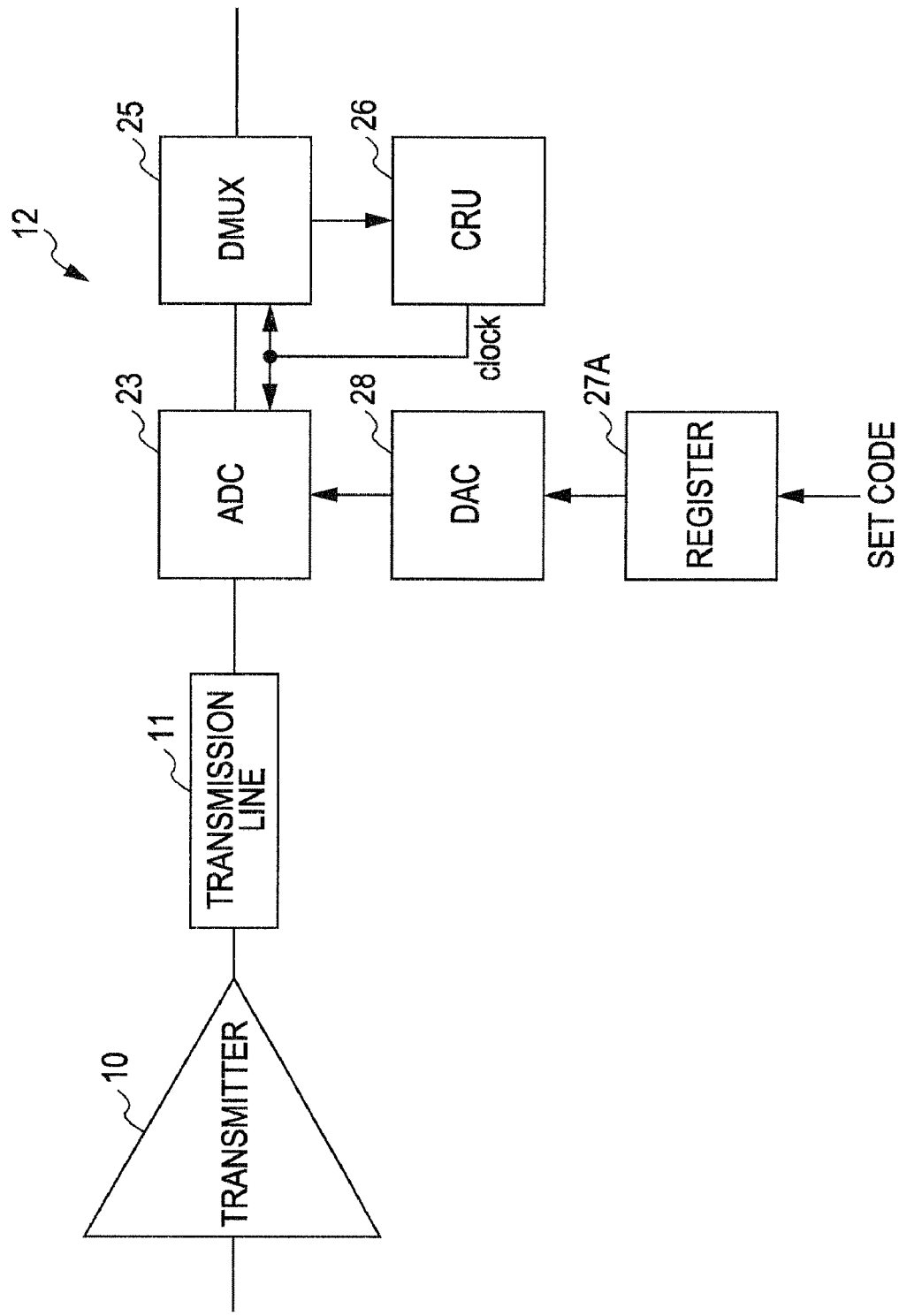
FIG. 14 is a diagram of another example of a circuit which sets a control signal for controlling an amplitude gain.

FIG. 14 is another example of a circuit which sets a control signal for controlling the amplitude gain. In FIG. 14, the same constituent elements as those of FIG. 13 are identified by the same reference numerals, and will not be explained again. In the configuration in FIG. 14, a register 27A and a digital-analog converter (DAC) 28 are included in the receiver 12. The user of the receiver 12 sets a code corresponding to a data rate in the register 27A of the receiver since the user knows the data rate corresponding to the standard for using the receiver 12. The DAC 28 performs digital-analog conversion for the code set in the register 27A, and generates an analog signal having a voltage corresponding to the code. The analog signal is supplied to each amplitude circuit of the ADC 23 through one control signal line 40. In this case, the amplitude circuit has the configuration illustrated in FIG. 9 and adjusts a coupling resistance value between the differential outputs of the amplitude circuit so as to control the amplitude gain in accordance with the voltage value of the analog signal supplied through the control signal line 40.

Figure 15:
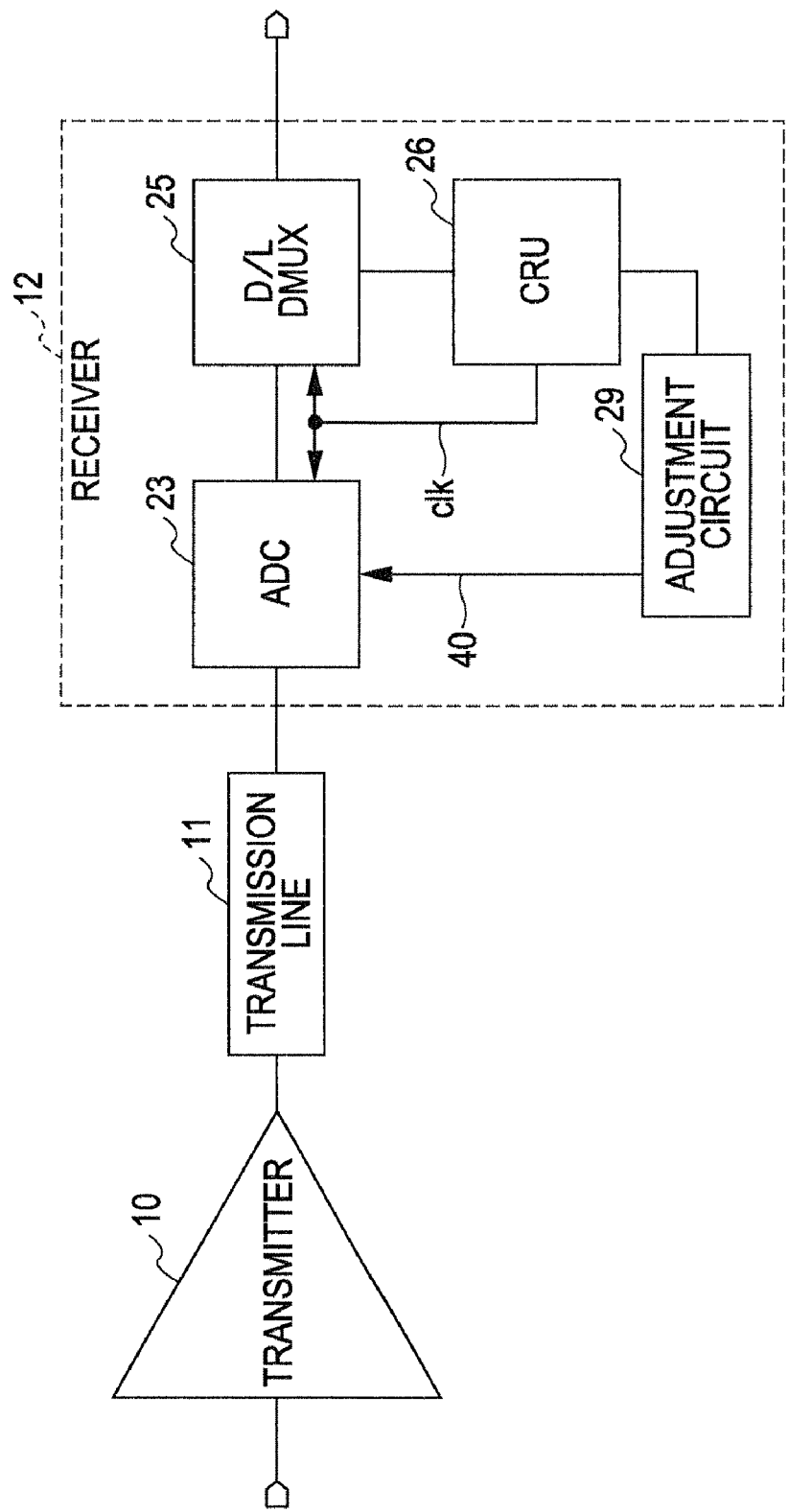
FIG. 15 is a diagram of still another example of a circuit which sets a control signal for controlling an amplitude gain.

FIG. 15 is still another example of a circuit which sets a control signal for controlling the amplitude gain. In FIG. 15, the same constituent elements as those in FIG. 1 are identified by the same reference numerals, and will not be explained again. FIG. 15 omits configurations that are not directly related to controlling of the amplitude gain of the ADC 23 (e.g., the equalizing circuit 24 of FIG. 1 is omitted).

In the configuration in FIG. 15, an adjustment circuit 29 is provided in the receiver 12. A clock recovery circuit (CRU) 26 recovers a clock signal based on a received data signal, and supplies the ADC 23 and a determination/de-multiplexing circuit 25 with the recovered clock signal clk. The clock recovery circuit (CRU) 26 generates a clock signal clk. This clock signal clk has a frequency that coincides with the data rate of the received data signal, and has also a phase that is suitable for the received data signal. The clock recovery circuit 26 functions as a data rate detecting circuit which detects the data rate of the received data signal. The clock recovery circuit 26 supplies the adjustment circuit 29 with a signal representing the detected data rate. The adjustment circuit 29 generates a control signal in accordance with the detected data rate, and supplies the ADC 23 with the control signal through the control signal lines 40.

Figures 16A, 16B:
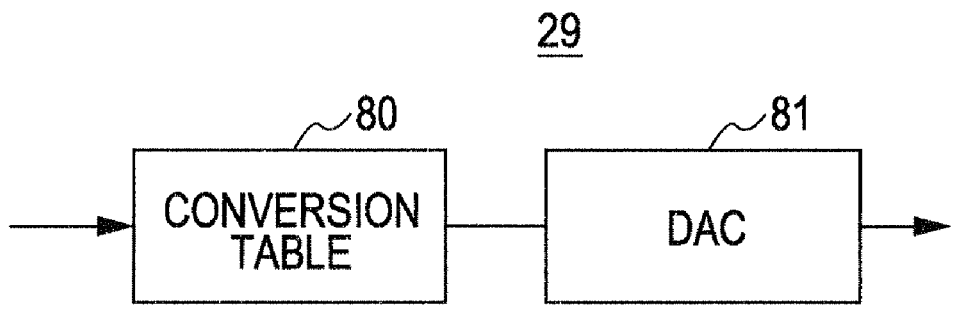
FIG. 16A and FIG. 16B are diagrams of examples of an adjustment circuit.

FIG. 16A and FIG. 16B are diagrams of examples of a configuration of the adjustment circuit 29. In FIG. 16A, the adjustment circuit 29 includes a conversion table 80 and a DAC 81. The conversion table 80 receives codes in accordance with the data rates of the received data signals from the clock recovery circuit 26. FIG. 16B is an example of the conversion table 80. The conversion table 80 stores a plurality of input codes and a plurality of output codes in a one-to-one correspondence with each other. When an input code is supplied to the conversion table 80, the table outputs the output code corresponding to the input code. The DAC 81 converts the code supplied from the conversion table 80 into an analog signal and generates an analog signal having a voltage corresponding to the code. This analog signal is supplied to each amplitude circuit of the ADC 23 through one control signal line 40. In this case, the amplitude circuit, which has the configuration illustrated in FIG. 9, adjusts a coupling resistance value between the differential outputs of the amplitude circuit so as to control the amplitude gain in accordance with a voltage value of the analog signal supplied through the control signal line 40. When the amplitude circuit having the configuration of FIGS. 10 and 11 is used, the DAC 81 may not be provided.

Figure 17:
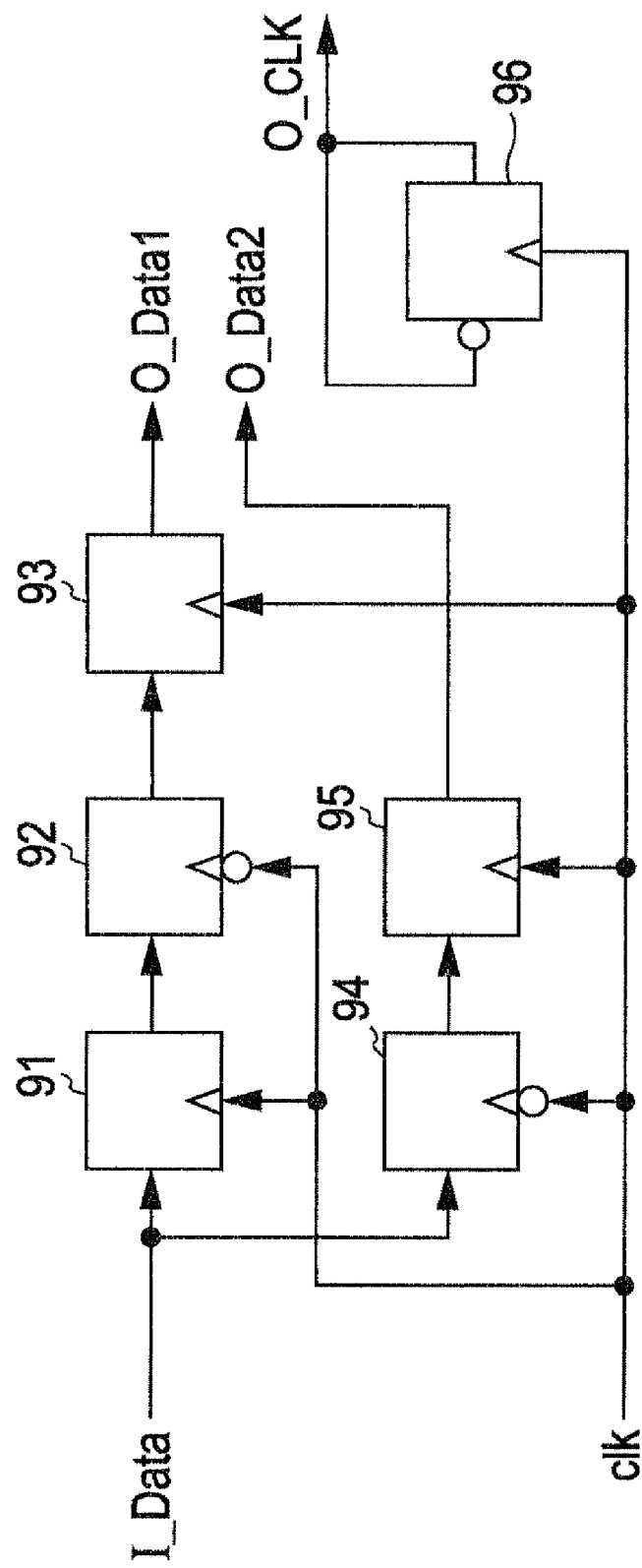
FIG. 17 is a diagram of an example of a demultiplexer of a determination/de-multiplexing circuit.
Figure 18:
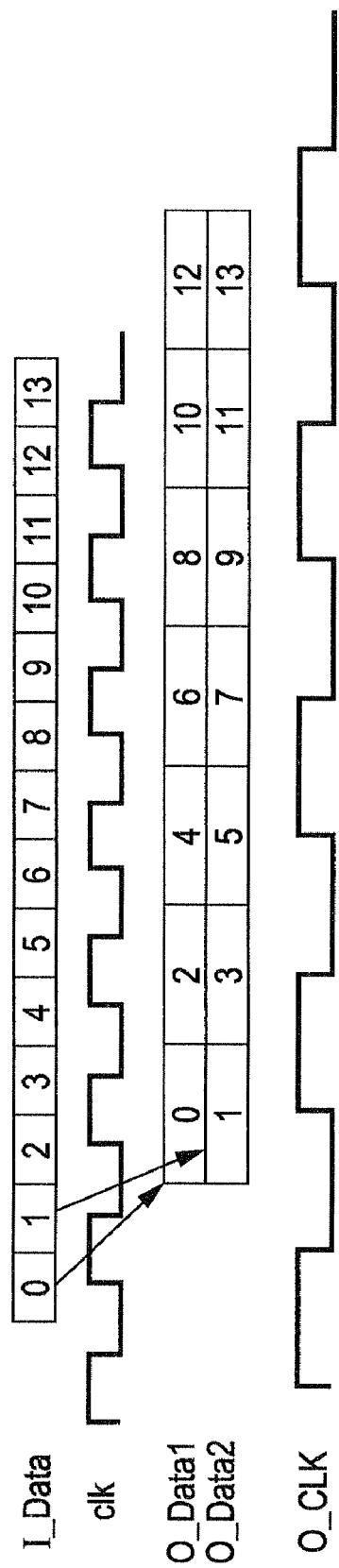
FIG. 18 is a diagram of an operation waveform of the determination/de-multiplexing circuit illustrated in FIG. 17.

FIG. 17 is a diagram of an example of a demultiplexer circuit included in the determination/de-multiplexing circuit 25. FIG. 18 is a signal waveform diagram of an operation of the determination/de-multiplexing circuit 25. In FIG. 17, the determination/de-multiplexing circuit 25 includes D flip-flops 91 to 96. The D flip-flops 91 to 93 detect even number data of input data I_Data, and outputs the data as first output data O_Data 1. The D flip-flops 94 to 95 detect odd number data of input data I_Data, and outputs the data as second output data O_Data 2. The D flip-flop 96 frequency-divides the input clock signal clk by two, and outputs the signal as an output clock signal O_CLK. With the configuration of such a demultiplexer, a 1:2 demultiplexing process can be performed.

Figure 19:
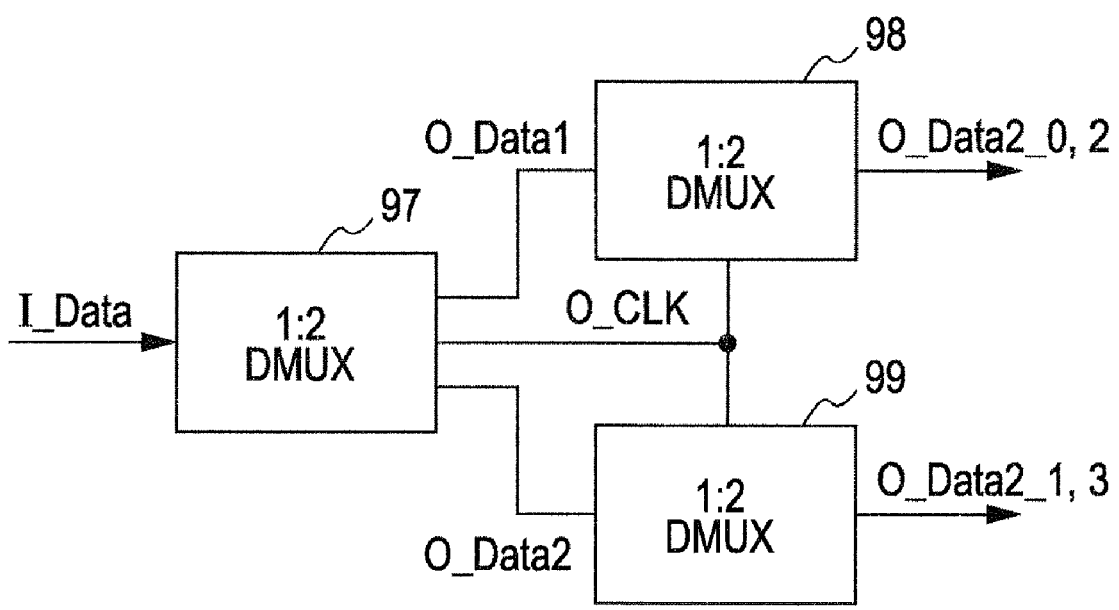
FIG. 19 is a diagram of an example of a circuit which performs a 1:4 de-multiplexing process.

FIG. 19 is a diagram of an example of a configuration of a circuit for executing a 1:4 demultiplexing process. 1:2 demultiplexing circuits (1:2 DMUX) 97 to 99 in FIG. 19 each have a circuitry configuration illustrated in FIG. 17. The 1:2 demultiplexing circuit 97 demultiplexes data into two (1:2). Then, the two demultiplexed signals are further demultiplexed by the 1:2 demultiplexing circuits 98 and 99. With this configuration, a 1:4 demultiplexing process can be performed.

Figure 20:
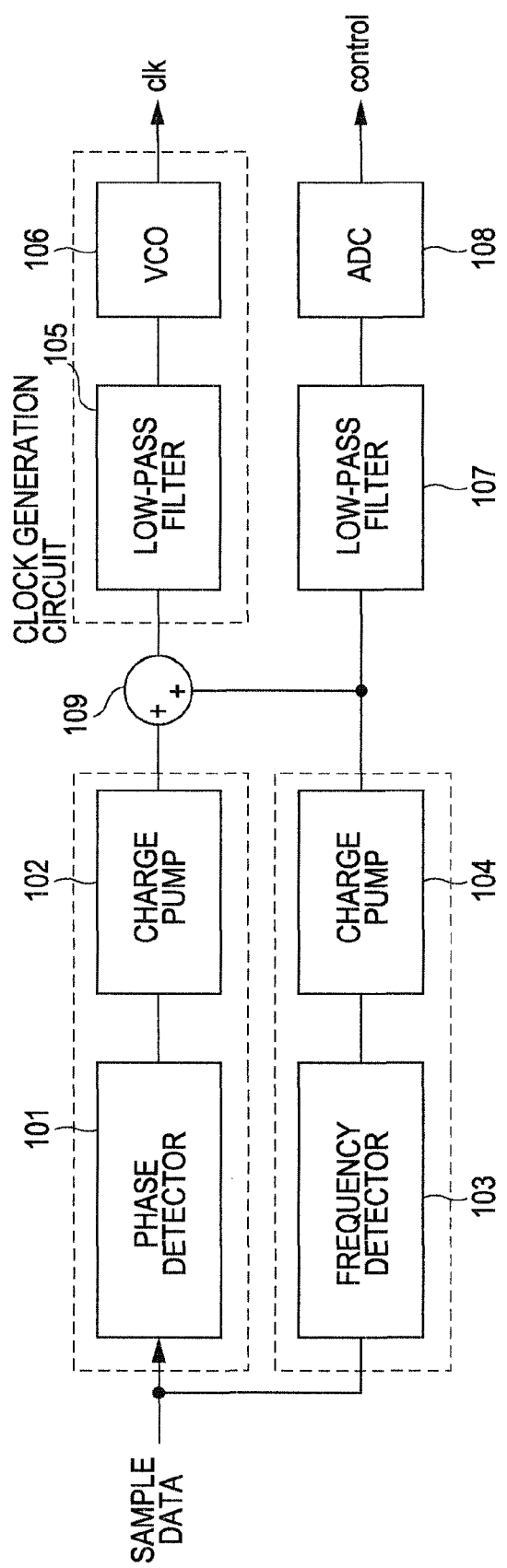
FIG. 20 is a diagram of an example of a clock recovery circuit.

FIG. 20 is a diagram of an example of a configuration of the clock recovery circuit 26. The clock recovery circuit 26 includes a phase detector 101, a charge pump 102, a frequency detector 103, a charge pump 104, a low-pass filter 105, a voltage controlled oscillator (VOC) 106, a low-pass filter 107, an ADC 108, and an adder 109. Sample data supplied to the phase detector 101 and the frequency detector 103 is the data output from the ADC 23.

The phase detector 101 detects a phase difference between the sample data and the clock signal clk, and outputs a signal representing the detected phase difference. The charge pump 102 increases or decreases the charging voltage of an internal capacitance element based on the signal representing the detected phase difference supplied from the phase detector 101. For example, if the signal representing the detected phase difference represents occurrence of a data transition of sample data prior to a specific edge of the clock signal clk, the charge pump decreases the charging voltage. If the signal representing the detected phase difference represents occurrence of a data transition of sample data after a specific edge of the clock signal clk, the charge pump increases the charging voltage. The low-pass filter 105 integrates a voltage signal including the output voltage as the charging voltage of the charge pump 102, and extracts a low frequency component that is not subject to noise. The voltage controlled oscillator 106 oscillates at a frequency corresponding to the output voltage of the low-pass filter 105, thereby generating a clock signal clk. This clock signal clk is used by the phase detector 101 to detect a phase difference. As a result of this feed-back control, the phase of the clock signal clk can be adjusted to an appropriate phase value.

Figure 21:
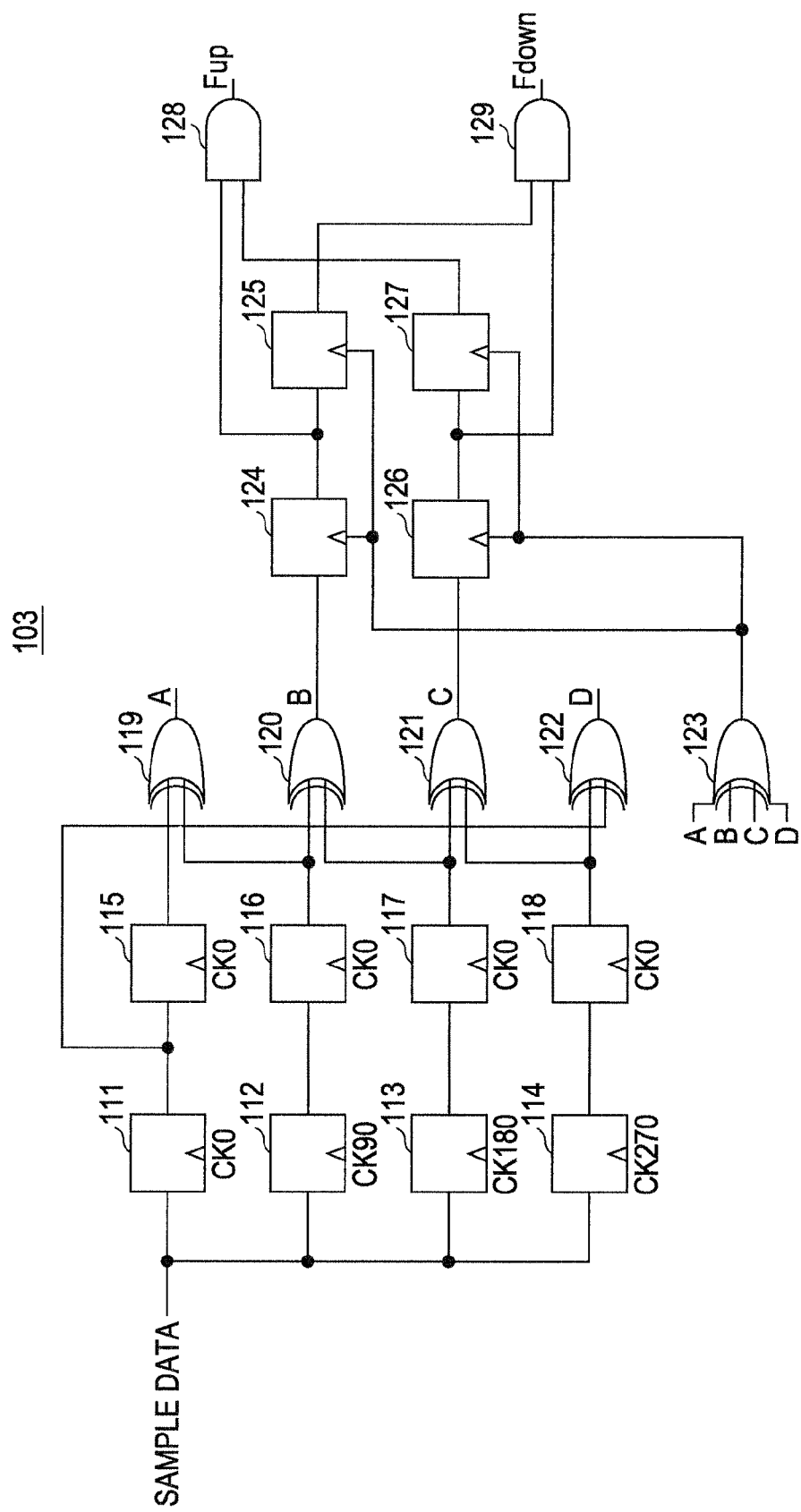
FIG. 21 is a diagram of an example of a frequency detector.

FIG. 21 is a diagram of an example of the frequency detector 103. The frequency detector 103 includes D flip-flops 111 to 118, XOR circuits 119 to 123, D flip-flops 124 to 127, and AND circuits 128 and 129. The D flip-flops 111 to 114 acquire sample data at 0° phase timing of a clock signal clk, at 90° phase timing of a clock signal clk, at 1800 phase timing of a clock signal clk, and at 270° phase timing of a clock signal clk. The D flip flops 111 to 114 again acquire the acquired four data items at 0° phase timing, thereby arranging effective timing of the four data items. The XOR circuit 119 calculates an exclusive OR on 0° phase timing data and 90° phase timing data, thereby generating an output signal A of "1" when both data items have different logical values. The XOR circuit 120 calculates an exclusive OR on 90° phase timing data and 180° phase timing data, thereby generating an output signal B of "1" when both data items have different logical values. The XOR circuit 121 calculates an exclusive OR on 180° phase timing data and 270° phase timing data, thereby generating an output signal C of "1" when both data items have different logical values. The XOR circuit 122 calculates an exclusive OR on 270° phase timing data and 0° timing data of next cycle, thereby generating an output signal D of "1" when both data items have different logical values. The XOR circuit 123 calculates an exclusive OR on the signals A to D, thereby generating an output signal of "1" when an odd number of signals (of the signals A to D) have a value "1". In one cycle of the clock signal clk, the XOR circuit 123 outputs "1" when a data transition occurs only once.

When the output of the XOR circuit 123 changes from "0" to "1" the D flip-flop 124 acquires the signal B. When the output of the XOR circuit 123 changes from "0" to "1" the output of the D flip flop 124 is acquired by the D flip-flop 125. Similarly, when the output of the XOR circuit 123 changes from "0" to "1" the D flip-flop 126 acquires the signal C. When the output of the XOR circuit 123 changes from "0" to "1", the output of the D flip-flop 126 is acquired by the D flip-flop 127.

The AND circuit 128 outputs a signal Fup instructing an increase in the frequency when both of the output of the D flip flop 124 and the output of the D flip flop 127 are "1". That is, when a data transition occurs between 180° phase and 270° phase before the present time, and when a data transition occurs between 90° phase and 180° phase at the present time, it is judged that the frequency is low. In this case, a signal Fup is output. This signal Fup instructs an increase in the frequency. The AND circuit 129 asserts the output, a signal Fdown, instructing a decrease in the frequency when the output of the D flip-flop 126 and the output of the D flip-flop 125 are both "1". When a data transition occurs between 90° phase and 180° phase before the present time, and when a data transition occurs between 180° phase and 270° phase at the present time, it is judged that the frequency is HIGH. In this case, a signal Fdown is output. The signal Fdown instructs a decrease in the frequency.

Referring back to FIG. 20, the charge pump 104 increases or decreases the charging voltage of the internal capacitance element based on the signal Fup and Fdown supplied from the frequency detector 103. The low-pass filter 105 integrates the voltage signal including the output voltage (the above-described charging voltage) of the charge pump 104 and extracts a low frequency component that is not subject to noise. The voltage controlled oscillator 106 oscillates at a frequency corresponding to the output voltage of the low-pass filter 105, thereby generating a clock signal clk. This clock signal clk is used by the frequency detector 103 in order to detect the frequency. As a result of this feed-back control, the frequency of the clock signal clk is adjusted to an appropriate value.

The low-pass filter 107 integrates a voltage signal which is the output voltage (the above-described charging voltage) of the charge pump 104, and extracts a low frequency component that is not subject to noise. The voltage signal as the output of the low-pass filter 107 has a voltage value corresponding to the frequency extracted from the received data (e.g., the data rate of the received data). The ADC 108 converts the output analog voltage of the low-pass filter 107 into a digital value. This digital signal is supplied to each amplitude circuit of the ADC 23 through the plurality of control signal lines 40. In this case, the amplitude circuit has the configuration illustrated in FIGS. 10 and 11, and adjusts the amount of current flowing through the current source of the amplitude circuit so as to control the amplitude gain in accordance with the digital signal value supplied through the control signal lines 40. When the amplitude circuit having the configuration of FIG. 9 is used, the ADC 108 may be omitted.

Figure 22:
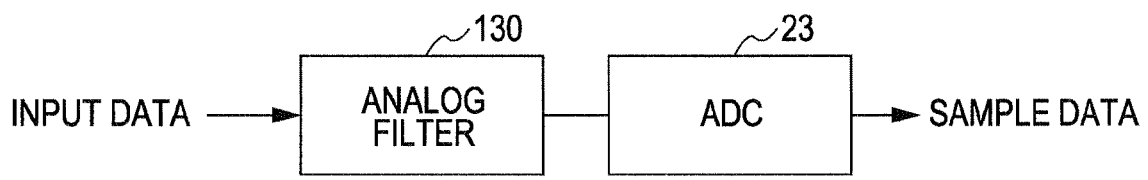
FIG. 22 is a diagram of an example of an analog filter provided at the preceding stage of an ADC.

The output signal of the ADC 23 is plural bit digital data. Out of the plurality of bits of the output data of the ADC 23, only the most significant bit may be used as sample data to be input to the clock recovery circuit 26. At this time, if an input signal deteriorates due to the transmission line 11 of FIG. 1, the received data cannot appropriately be extracted from the most significant bit of the ADC 23. In this case, an analog filter 130 having the characteristic inverse to the frequency characteristic of the transmission line 11 may be provided in front of the ADC 23. FIG. 22 is a diagram of an example of providing the analog filter 130 at a stage preceding the ADC 23.

Figure 23:
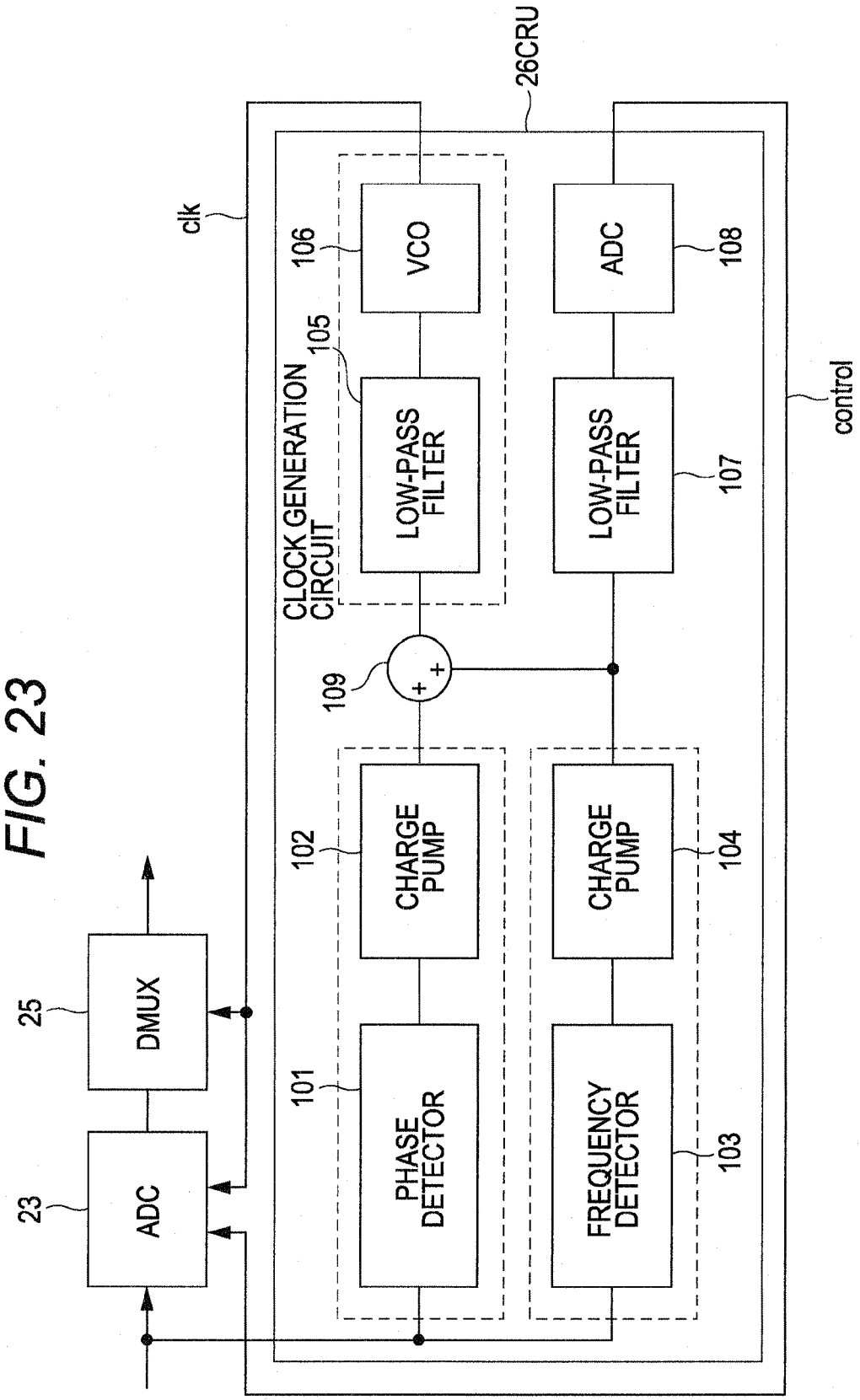
FIG. 23 is a diagram of still another example of a circuit which sets a control signal for controlling an amplitude gain.
Figure 24:
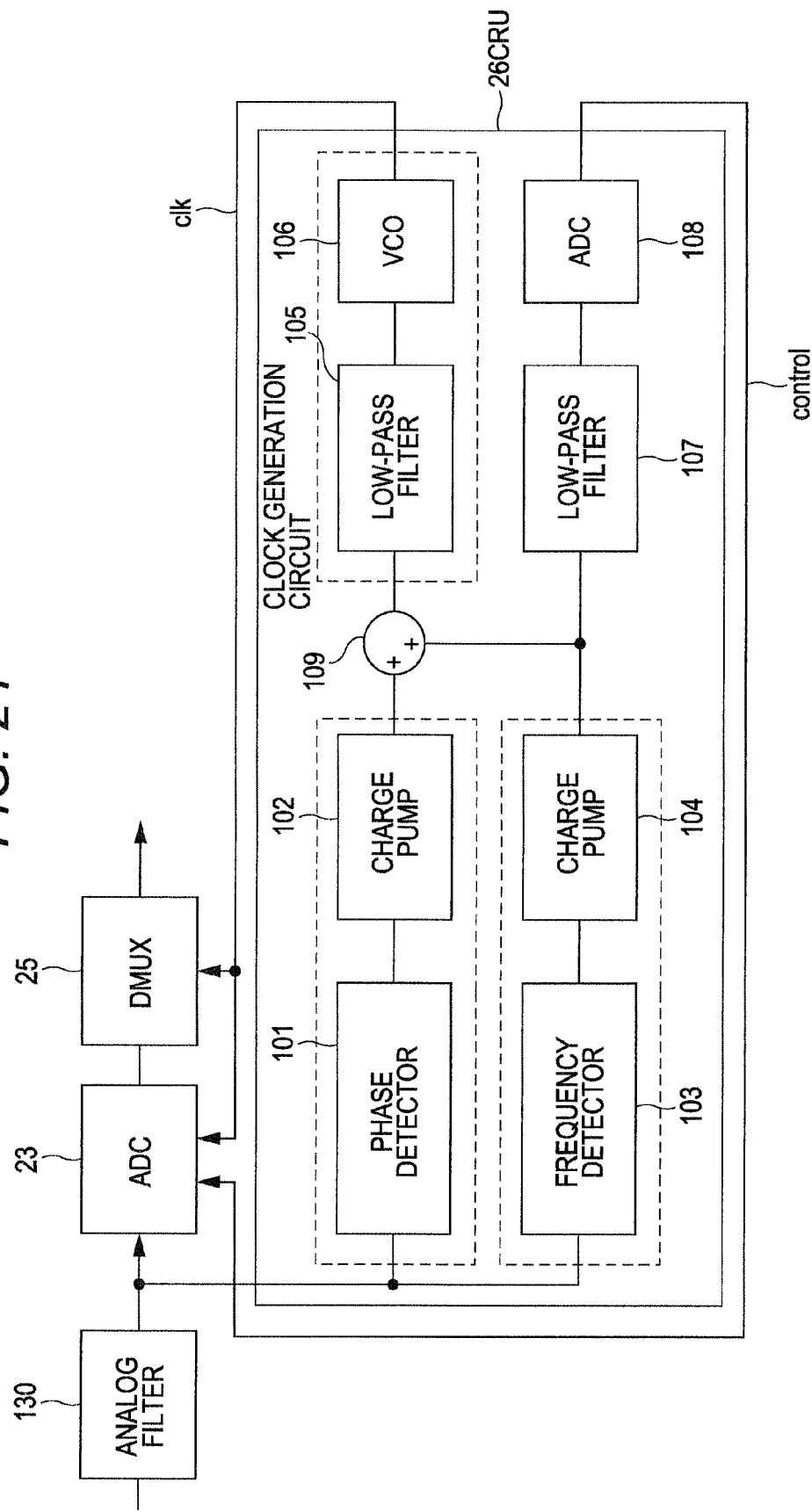
FIG. 24 is a diagram of an example of a circuit wherein an analog filter is provided at the preceding stage of the ADC.

FIG. 23 is a diagram of another example of a circuit which sets a control signal for controlling the amplitude gain. In FIG. 23, the same constituent elements as those of FIGS. 1 and 20 are identified by the same reference numerals, and will not be explained again. As illustrated in FIG. 23, the clock recovery circuit 26 having the configuration illustrated in FIG. 20 may recover the clock signal clk from the received data signal before the signal is input to the ADC 23. At this time, if the input signal deteriorates due to the transmission line 11 of FIG. 1, the received data cannot appropriately be extracted from the input signal. In this case, the analog filter 130 having the characteristic that is inverse to the frequency characteristic of the transmission line 11 may be provided in front of the ADC 23. FIG. 24 illustrates an example wherein the analog filter 130 is provided at a stage preceding the ADC 23.

Figure 25:
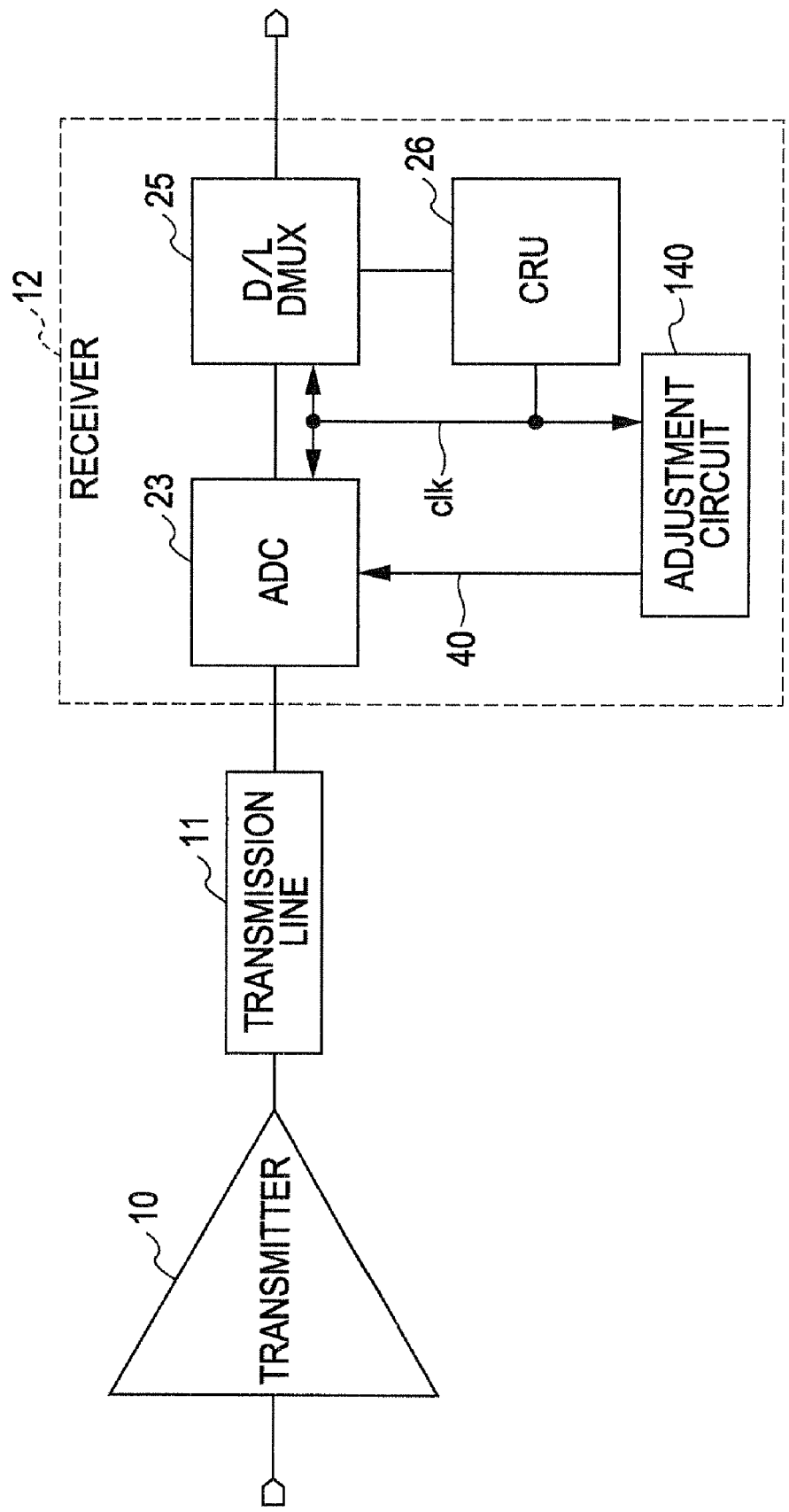
FIG. 25 is a diagram of still another example of a circuit which sets a control signal for controlling an amplitude gain.

FIG. 25 is a diagram of another example of a circuit which sets a control signal for controlling the amplitude gain. In FIG. 25, the same constituent elements as those of FIG. 1 are identified by the same reference numerals, and will not be explained again. FIG. 25 omits configurations that are not related directly to controlling of the amplitude gain of the ADC 23 (e.g., the equalizing circuit 24 of FIG. 1 is omitted).

In the circuit illustrated in FIG. 25, an adjustment circuit 140 is provided in the receiver 12. The clock recovery circuit (CRU) 26 recovers a clock signal based on a received data signal, and supplies the ADC 23 and the determination/demultiplexing circuit 25 with the recovered clock signal clk. The clock recovery circuit 26 generates a clock signal. This clock signal has a frequency coinciding with the data rate of the received data signal and has a phase that is suitable for the received data signal. The adjustment circuit 140 generates a control signal in accordance with the clock signal clk generated by the clock recovery circuit 26. The adjustment circuit 140 supplies the ADC 23 with the control signal through the control signal lines 40.

Figure 26:
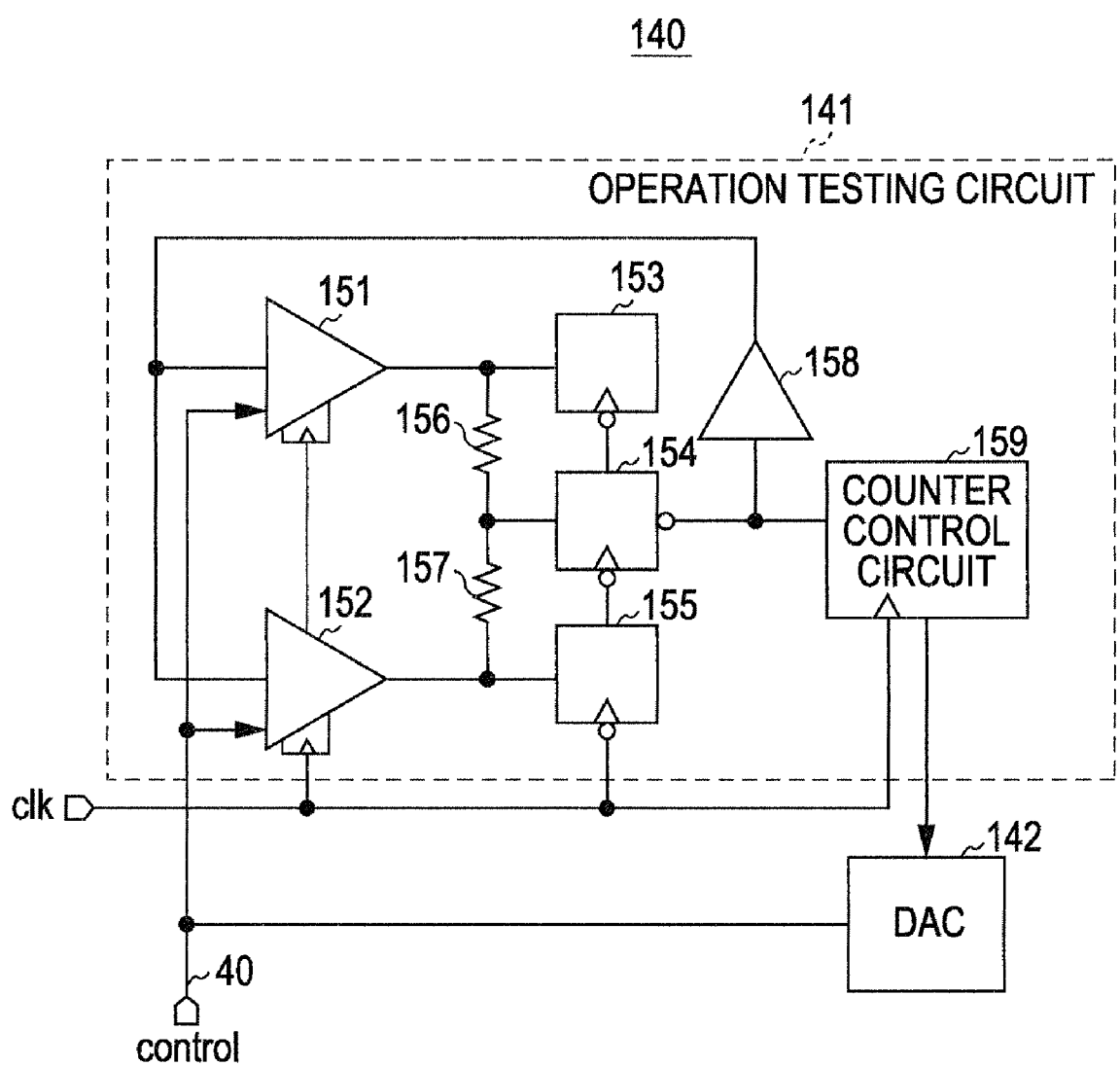
FIG. 26 is a diagram of an example of an adjustment circuit.

FIG. 26 is a diagram of an example of a configuration of the adjustment circuit 140. The adjustment circuit 140 includes an operation testing circuit 141 and a DAC 142. The operation testing circuit 141 includes amplitude circuits 151 and 152, comparison circuits 153 to 155, resistive elements 156 and 157, an amplitude adjustment circuit 158, and a counter control circuit 159. The amplitude circuits 151 and 152, the comparison circuits 153 to 155, and the resistive elements 156 and 157 have the same configurations respectively as those of the amplitude circuits 35-1 and 35-3, the comparison circuits 36-1 to 36-3, and the resistive elements 37 and 38 illustrated in FIG. 3. With this configuration, the operation testing circuit 141 functions as a replica circuit for simulating an analog-digital conversion operation of the ADC 23.

The amplitude circuit 151 amplifies a voltage difference between a first reference voltage and an output voltage of the amplitude adjustment circuit 158. The amplitude circuit 152 amplifies a voltage difference between a second reference voltage and an output voltage of the amplitude adjustment circuit 158. The first reference voltage and the second reference voltage may correspond to the voltage Vref-1 and the voltage Vref-3 in FIG. 4. The reference voltages may correspond to two other adjacent reference voltages Vref-x (where "x" is an integer from 1 to M-2) and Vref-x+2.

The output voltage of the amplitude circuit 151 and the output voltage of the amplitude circuit 152 are resistance-divided by the resistive element arrays 156 and 157. The logical values of the resistance-divided voltage values are judged by the comparison circuit 154. The output voltage signal representing the judgment result of the comparison circuit 154 is amplitude-adjusted by the amplitude adjustment 158, and then input to the amplitude circuits 151 and 152. As a result of amplitude adjustment by the amplitude adjustment circuit 158, the signal input from the amplitude adjustment circuit 158 to the amplitude circuits 151 and 152 is set to an appropriate amplitude corresponding to the reference voltages used by the amplitude circuits 151 and 152.

The output of the comparison circuit 154 is a negative logic output. When an appropriate amplitude operation and determination operation are performed, the output signal of the comparison circuit 154 is alternately "0" and "1" due to the feedback to the input to the amplitude circuits 151 and 152 through the amplitude adjustment circuit 158. The counter control circuit 159 counts the number of transitions between "0" and "1" of the output signal of the comparison circuit 154. The counter control circuit 159 supplies the DAC 142 with a count value representing the number of transitions counted with the clock signal clk in a specific time length. The DAC 142 converts the count value from a digital signal to an analog signal so as to generate an analog control signal "control" and sends the signal to the control signal lines 40. The operation testing circuit 141 and the ADC 23 adjust the amplitude gain of the amplitude circuit in response to the control signal "control" supplied through the control signal lines 40.

When the operation testing circuit 141 performs the appropriate amplitude operation and determination operation, the output signal of the comparison circuit 154 is alternately "0" and "1", and the signal transition occurs a Y-number of times in a specific period of time. When the count value is lower than the Y-number, it can be considered that the amplitude circuit for the clock signal clk performs an amplitude operation at a relatively high speed, and that an appropriate amplitude operation and determination operation are not performed by the ADC 23 and the operation testing circuit 141. In this case, the amplitude gain of the amplitude circuit can be adjusted to decrease in response to the control signal "control" Such an amplitude circuit is illustrated, for example, in FIG. 9. The coupling resistance value between the differential outputs of the amplitude circuit is adjusted so as to control the amplitude gain in accordance with the voltage value of the analog signal supplied through the control signal lines 40. When the amplitude circuit in FIGS. 10 and 11 is used, a data conversion table may be provided in place of the DAC 142. This data conversion table has the same circuitry configuration as the table in FIG. 16B.

According to at least one embodiment, the amplitude gain can be set to an appropriate value by controlling the amplitude gain of the amplitude circuit. An appropriate amplitude gain can be set at a corresponding transmission speed for a relatively high signal transmission speed and a relatively low signal transmission speed. As a result, it is possible to provide a receiver which can handle signal transmission at a wide range of signal transmission speeds.

The parallel comparison AD converter disclosed in the above embodiment includes a first amplitude circuit, a second amplitude circuit, a determination circuit, and a control signal line. The first amplitude circuit amplifies a voltage difference between a first reference signal and an input signal. The second amplitude circuit amplifies a voltage difference between a second reference signal and the input signal. The determination circuit performs resistance-division on a first output voltage of the first amplitude circuit and a second output voltage of the second amplitude circuit, and determines a logical value of the resistance-divided voltage value. The control signal line controls an amplitude gain of each of the first amplitude circuit and the second amplitude circuit.

The data receiver disclosed in the above embodiment includes a first amplitude circuit, a second amplitude circuit, a determination circuit, and a control signal line. The first amplitude circuit amplifies a voltage difference between a first reference signal and a received data signal. The second amplitude circuit amplifies a voltage difference between a second reference signal and the received data signal. The determination circuit performs resistance-division on a first output voltage of the first amplitude circuit and a second output voltage of the second amplitude circuit, and determines a logical value of a resistance-divided voltage value. The control signal line controls an amplitude gain of each of the first amplitude circuit and the second amplitude circuit.

The data reception method disclosed in the above embodiment includes inputting a received data signal to a first amplitude circuit and a second amplitude circuit, controlling an amplitude gain of each of the first amplitude circuit and the second amplitude circuit based on a data rate of the received data signal, and determining a logical value of a resistance-divided voltage value which is obtained by performing resistance-division on a first output signal of the first amplitude circuit and a second output signal of the second amplitude circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An AD converter comprising:
a first amplitude circuit for amplifying a first voltage difference between a first voltage of a first reference signal and a second voltage of an input signal, and outputting a first output voltage signal;
a second amplitude circuit for amplifying a second voltage difference between a third voltage of a second reference signal and the second voltage of the input signal, and outputting a second output voltage signal;

a determination circuit for performing resistance-division on the first output voltage signal and the second output voltage signal, and determining a logical value of a resistance-divided voltage value; and a control signal line for controlling a first amplitude gain of the first amplitude circuit and a second amplitude gain of the second amplitude circuit.

2. The AD converter according to claim 1, wherein the control signal line is controlled in accordance with a frequency of a clock signal defining a determination timing of the determination circuit.

3. The AD converter according to claim 2, wherein a timing at which the first amplitude circuit and the second amplitude circuit start amplification is controlled according to the clock signal.

4. The AD converter according to claim 2, further comprising:

a data rate detecting circuit for detecting a data rate of the input signal, wherein the frequency of the clock signal is controlled in accordance with the data rate of the input signal that is detected by the data rate detecting circuit.

5. The AD converter according to claim 4, further comprising:

a DA converter for generating an analog signal corresponding to the data rate of the input signal that is detected by the data rate detecting circuit, and outputting the analog signal to the control signal line, wherein the first amplitude gain of the first amplitude circuit and the second amplitude gain of the second amplitude circuit are controlled according to the analog signal.

6. The AD converter according to claim 1, further comprising:

a third amplitude circuit for amplifying a third voltage difference between the first voltage of the first reference signal and a fourth voltage of a test signal, and outputting a third output voltage signal;

a fourth amplitude circuit for amplifying a fourth voltage difference between the second voltage of the second reference signal and the fourth voltage of the test signal, and outputting a fourth output voltage signal; and a test determination circuit for performing resistance-division on the third output voltage signal of the third amplitude circuit and the fourth output voltage signal of the fourth amplitude circuit so as to determine a logical value of the resistance-divided voltage value, wherein the control signal of the control signal line is generated in accordance with the logical value determined by the test determination circuit, and a third amplitude gain of the third amplitude circuit and a fourth amplitude gain of the fourth amplitude circuit are controlled according to the control signal.

7. The AD converter according to claim 1, wherein the first amplitude circuit is a first differential amplitude circuit, a first resistance value of a first resistance element, provided between a first output terminal and a second output terminal of the first differential amplitude circuit, is controlled by the control signal line so as to control the first amplitude gain, the second amplitude circuit is a second differential amplitude circuit, a second resistance value of a second resistance element, provided between a third output terminal and a fourth output terminal of the second differential amplitude circuit, is controlled by the control signal line so as to control the second amplitude gain.

8. The AD converter according to claim 1, wherein the first amplitude circuit is a first differential amplitude circuit, the second amplitude circuit is a second differential amplitude circuit, and a first amount of current flowing to a first current source of the first differential amplitude circuit and a second amount of current flowing to a second current source of the second differential amplitude circuit are controlled by the control signal line so as to control the first amplitude gain and the second amplitude gain.

9. A data receiver comprising:

a first amplitude circuit for amplifying a first voltage difference between a first voltage of a first reference signal and a second voltage of a received data signal;

a second amplitude circuit for amplifying a second voltage difference between a third voltage of a second reference signal and the second voltage of the received data signal;

a determination circuit for performing resistance-division on a first output voltage signal of the first amplitude circuit and a second output voltage signal of the second amplitude circuit, and determining a logical value of a resistance-divided voltage value; and a control signal line for controlling a first amplitude gain of the first amplitude circuit and a second amplitude gain of the second amplitude circuit.

10. The data receiver according to claim 9, further comprising:

a clock recovery circuit for generating a clock signal based on the received data signal, wherein the first amplitude gain and the second amplitude gain are controlled in accordance with a frequency of the clock signal generated by the clock recovery circuit.

11. A data reception method comprising:

inputting a received data signal to a first amplitude circuit and a second amplitude circuit;

controlling a first amplitude gain of the first amplitude circuit and a second amplitude gain of the second amplitude circuit according to a data rate of the received data signal; and determining a logical value of a voltage value obtained by performing resistance-division on a first output signal of the first amplitude circuit and a second output signal of the second amplitude circuit.

12. The data reception method according to claim 11, further comprising:

generating a clock signal based on the received data signal; and determining a logical value of a resistance-divided voltage value according to the clock signal.

13. The data reception method according to claim 12, wherein a timing at which the first amplitude circuit and the second amplitude circuit start amplification is controlled in accordance with the clock.

* * * * *